(12) United States Patent
Wright

(10) Patent No.: US 7,859,333 B2
(45) Date of Patent: Dec. 28, 2010

(54) POWER AMPLIFIER WITH RECONFIGURABLE DIRECT CURRENT COUPLING

(75) Inventor: Peter Wright, Hillsboro, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 12 days.

(21) Appl. No.: 12/364,759

(22) Filed: Feb. 3, 2009

(65) Prior Publication Data

US 2010/0194473 A1 Aug. 5, 2010

(51) Int. Cl.
*H03F 3/68* (2006.01)
(52) U.S. Cl. ............... 330/124 R; 330/297; 330/127
(58) Field of Classification Search .............. 330/295, 330/124 R, 297, 127, 129, 134, 274, 51
See application file for complete search history.

(56) References Cited

U.S. PATENT DOCUMENTS

| 6,538,515 B2 * | 3/2003 | Brandt | 330/285 |
|---|---|---|---|
| 6,650,180 B2 | 11/2003 | Lautzenhiser et al. | |
| 6,683,499 B2 | 1/2004 | Lautzenhiser et al. | |
| 6,690,238 B2 | 2/2004 | Lautzenhiser et al. | |
| 6,747,517 B2 | 6/2004 | Lautzenhiser et al. | |
| 6,900,696 B2 | 5/2005 | Lautzenhiser et al. | |
| 6,922,106 B2 | 7/2005 | Lautzenhiser et al. | |

OTHER PUBLICATIONS

Kevin W. Kobayashi, et al.; A 44-GHz High IP3 InP-HBT Amplifier with Practical Current Reuse Biasing; IEE Transactions on Microwave Theory and Techniques, vol. 46, No. 12, Dec. 1998.
International Search Report and Written Opinion re PCT/US10/22282 dated Sep. 3, 2010.

* cited by examiner

*Primary Examiner*—Hieu P Nguyen
(74) *Attorney, Agent, or Firm*—Schwabe Williamson & Wyatt

(57) ABSTRACT

Embodiments of circuits, systems, and methods relating to a power amplifier with a reconfigurable direct current coupling are disclosed. Other embodiments may be described and claimed.

24 Claims, 22 Drawing Sheets

POWER AMPLIFIER WITH RECONFIGURABLE DIRECT CURRENT COUPLING

FIELD

Embodiments of the present disclosure relate generally to the field of circuits, and more particularly to a power amplifier with reconfigurable direct current (DC) coupling.

BACKGROUND

Power amplifiers for cellular handsets are optimized for efficiency at, or close to, maximum output power. However, in the field, they may only be called upon to operate near maximum output power for a very small percentage of the time. The rest of the time, they may be operating at back-off output power levels, where their DC to radio-frequency (RF) conversion efficiency is very much reduced. This loss in efficiency under practical conditions results in increased thermal dissipation in the handset and reduced talk time.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "A/B" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled to each other.

Figure 1:
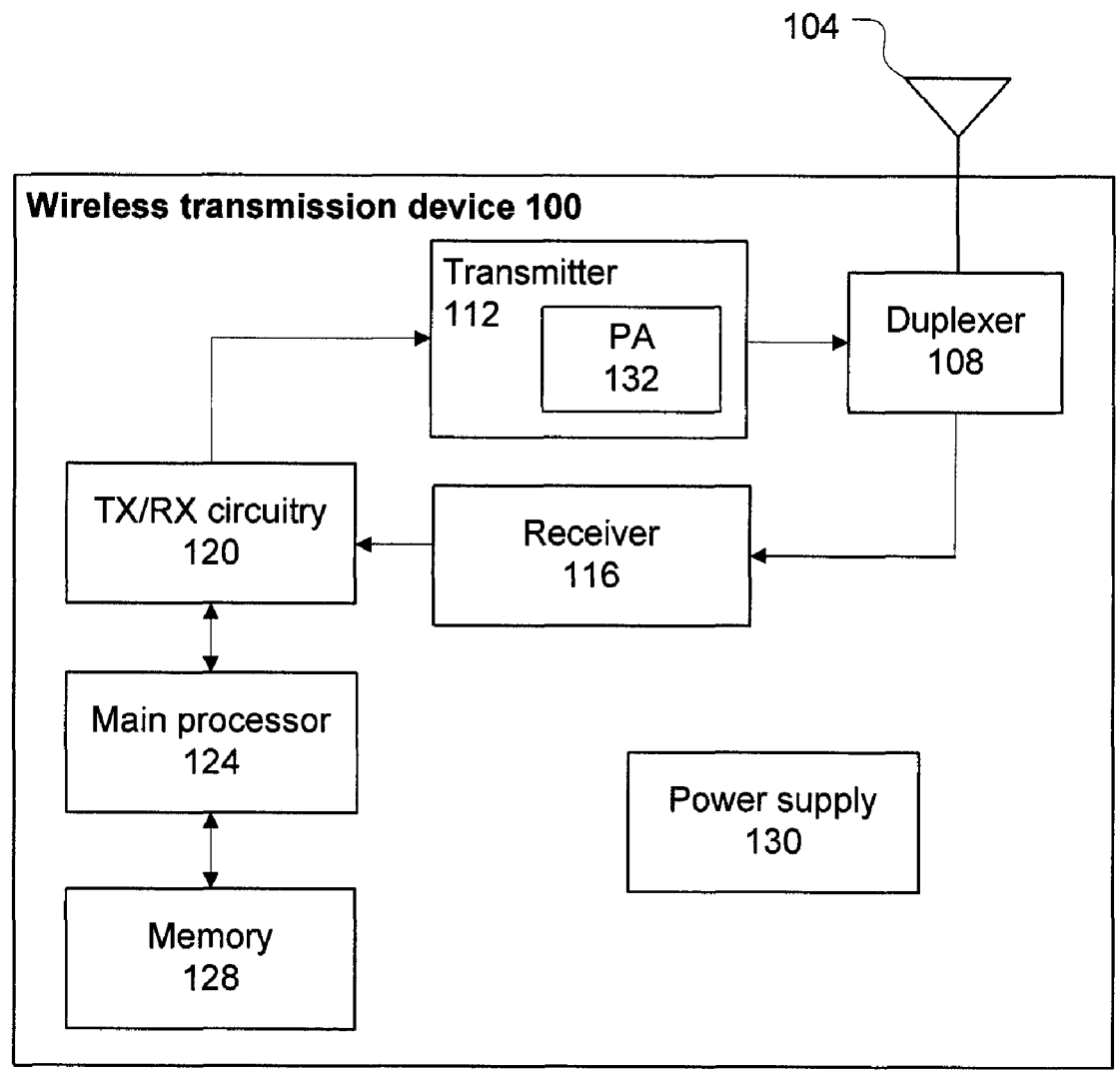
FIG. 1 illustrates a wireless device in accordance with some embodiments.

FIG. 1 illustrates a wireless transmission device 100 in accordance with various embodiments. The wireless transmission device 100 may have an antenna structure 104, a duplexer 108, a transmitter 112, a receiver 116, transmit/receive (TX/RX) circuitry 120, a main processor 124, and a memory 128 coupled with each other at least as shown. The wireless transmission device 100 may also include a power supply 130, e.g., a battery, coupled with the various components to provide DC power.

In various embodiments, the wireless transmission device 100 may be, but is not limited to, a mobile telephone, a paging device, a personal digital assistant, a text-messaging device, a portable computer, a base station, a radar, a satellite communication device, or any other device capable of wirelessly transmitting RF signals.

The main processor 124 may execute a basic operating system program, stored in the memory 128, in order to control the overall operation of the wireless transmission device 100. For example, the main processor 124 may control the reception of signals and the transmission of signals by TX/RX circuitry 120, receiver 116, and transmitter 112. The main processor 124 may be capable of executing other processes and programs resident in the memory 128 and may move data into or out of memory 128, as desired by an executing process.

The TX/RX circuitry 120 may receive outgoing data (e.g., voice data, web data, e-mail, signaling data, etc.) from the main processor 124. The TX/RX circuitry 120 may transmit an RF signal that represents the outgoing data to the transmitter 112. The transmitter 112 may include a power amplifier (PA) 132 to amplify the RF signal for transmission. The amplified RF signal may be forwarded to the duplexer 108 and then to the antenna structure 104 for an over-the-air (OTA) transmission.

The PA 132 may operate at various output power levels depending on the mode of the wireless transmission device 100. For example, if the wireless transmission device 100 is a Global System for Mobile communications (GSM) device, the PA 132 may operate at a full power level of approximately 35 decibels (dB). However, when the wireless transmission device 100 is operating in an enhanced data rate for GSM evolution (EDGE) mode, it may operate with a 6 dB back-off, e.g., at 29 dB. As will be described in further detail below, the PA 132 may have a reconfigurable DC coupling that may facilitate efficient operation over a variety of output power levels. While GSM and EDGE standards may be discussed, teachings of this disclosure may apply equally well to other standards, e.g., CDMA, W-CDMA, etc.

In a manner complementary to the transmission operation, the TX/RX circuitry 120 may receive an incoming OTA signal from the antenna structure 104 through the duplexer 108 and receiver 116. The TX/RX circuitry 120 may process and send the incoming signal to the main processor 124 for further processing. While the wireless transmission device 100 is shown with transmitting and receiving capabilities, other embodiments may include wireless transmission devices without receiving capabilities.

In various embodiments, the antenna structure 104 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Figure 2:
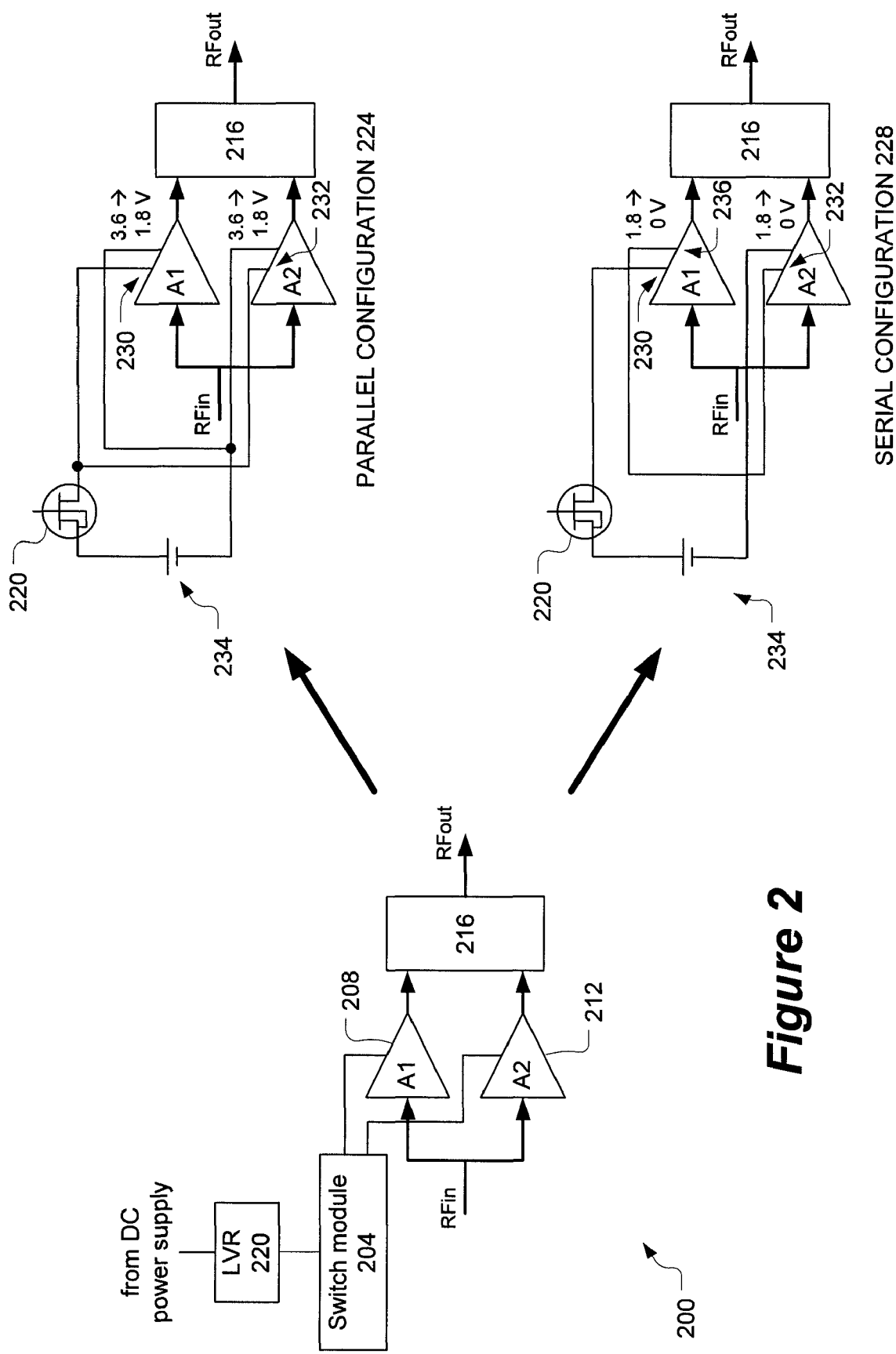
FIG. 2 illustrates DC reconfiguration options of a power amplifier (PA) in accordance with some embodiments.

FIG. 2 illustrates DC reconfiguration options of a PA 200 in accordance with some embodiments. The PA 200, and other PAs described herein, may have elements similar to like-named elements of other PAs. Unless specifically stated, any described PA may be interchangeable with any other of the described PAs.

The PA 200 may include a switch module 204 to couple a DC power supply with a PA block 208 and a PA block 212 in a reconfigurable manner. The PA blocks 208 and 212, which may be of equal size, may each receive an RF input signal, RFin, in parallel, and provide amplified RF signals to a combiner 216, which combines, e.g., sums, the amplified RF signals and provides the RF output signal, RFout.

The switch module 204 may be coupled with the DC power supply through a DC linear voltage regulator (LVR) 220 that regulates, e.g., controls, the level of the voltage provided to the PA blocks 208 and 212. The LVR 220 may be, e.g., a positive-channel metal oxide semiconductor (PMOS) low dropout (LDO) regulator.

Certain components, e.g., transistors, may be shown or described in conventions typically associated with particular materials, structures, polarities, etc. However, unless noted otherwise, other materials, structures, polarities, etc. may be used in other embodiments of the present disclosure with appropriate modifications being made to the implementing device/system. With particular reference to transistors, unless otherwise noted, a transistor may be made with any type of material, e.g., germanium, silicon, gallium arsenide, aluminum gallium arsenide, silicon carbide, etc.; any type of structure, e.g., bipolar junction transistor (BJT), junction gate field effect transistor (JFET), metal-oxide semiconductor FET (MOSFET), heterojunction bipolar transistor (HBT), insulated-gate bipolar transistor (IGBT), etc.; and/or any type of polarity, e.g., N-channel, P-channel, NPN, PNP, etc. Furthermore, in some embodiments, suitable transistor-like technologies may used in place of transistors.

In this embodiment, the switch module 204 may include a switch capable of configuring the DC coupling as either a parallel configuration 224 or a series configuration 228, and logic for controlling the switch. The switch module 204 may configure the DC coupling in either the parallel configuration 224 or the serial configuration 228 based at least in part on a desired output power level of the PA 200.

In the parallel configuration 224, Vcc terminals 230 and 232 of the PA blocks 208 and 212, respectively, are coupled with the DC power supply, e.g., battery 234, in parallel. In the serial configuration 228, the Vcc terminals 230 and 232 of the PA blocks 208 and 212, respectively, are coupled with the battery 234 in series, e.g., the Vcc terminal 232 of the PA block 212 is coupled with an output terminal 236 of the PA block 208.

Figure 3:
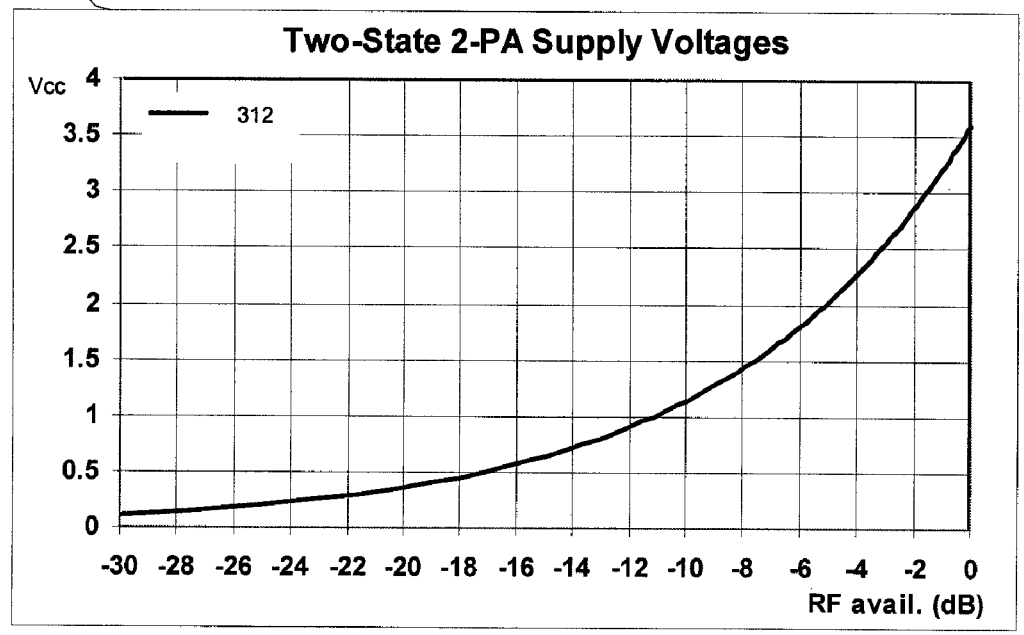
FIG. 3 provides charts depicting operating characteristics of a PA in accordance with some embodiments.
Figure 3:
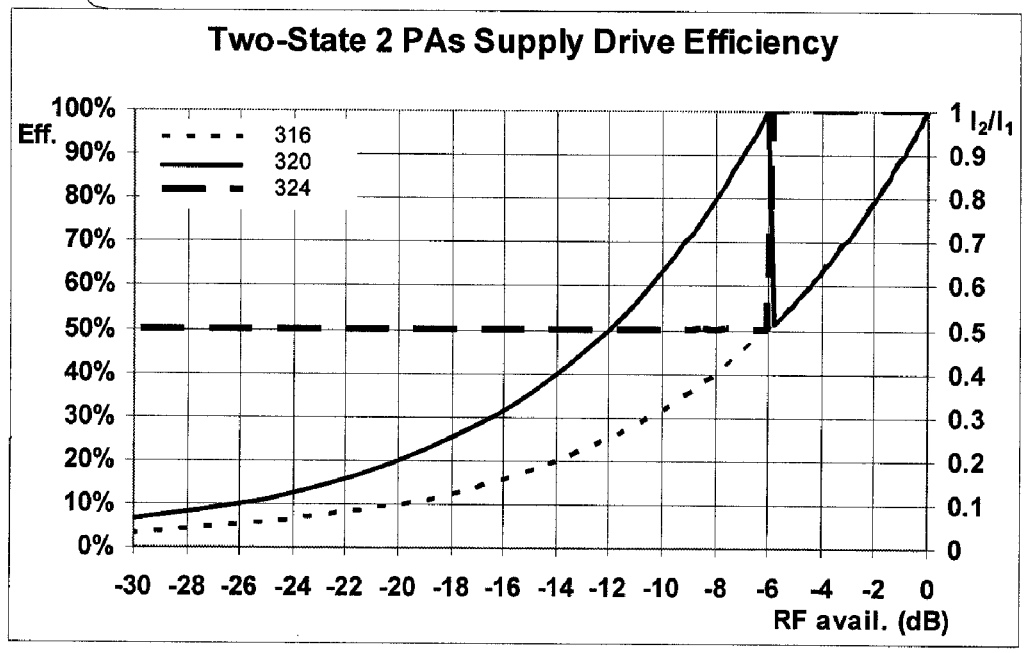

Operation of the PA 200 may now be described with reference to charts 304 and 308 of FIG. 3 in accordance with some embodiments. Chart 304 shows line 312 plotting Vcc as a function of output power. Chart 308 shows line 316 plotting a prior-art Vcc-controlled PA's supply drive efficiency as a function of output power; line 320 plotting supply drive efficiency of the PA 200 as a function of output power; and line 324 plotting a ratio of the current consumed by the PA 200 to the current consumed by the prior art PA.

When the PA 200 is operating at a full output power level, the LVR 220 may be a low impedance, and the switch module 204 may configure the PA 200 in the parallel configuration 224. This may result in the Vcc being approximately the power supply voltage Vbat, e.g., 3.6 V. In order to reduce the output power level, the LVR 220 may increase its impedance, lowering Vcc from Vbat to a reconfiguration voltage, Vrec, which may be 1.8 V in this embodiment. This may correspond to a 6 dB back-off output power level.

It may be seen from chart 308 that at this point, the supply drive efficiency, which is a measure of how efficiently the voltage is delivered to the PA blocks 208 and 212 from the battery 234, has dropped to approximately 50%. This may be a result of energy dissipated as heat from the LVR 220. Accordingly, instead of increasing the impedance of the LVR 220 and further reducing the supply drive efficiency, as is done in a prior art Vcc-controlled PA and shown by line 312, the switch module 204 may reconfigure the PA 200 to be in the serial configuration 228, and the LVR 220 may be reset to a low-impedance state. With the PA blocks 208 and 212 being appropriately sized, e.g., equal to one another, the Vcc that is provided to each PA block 208 and 212 will be half of the Vbat, e.g., 1.8 V. Furthermore, the low impedance state of the LVR 224 will not dissipate energy, and the supply drive efficiency may spike back up to approximately 100%, as shown by the line 320. In actual operation, the supply drive efficiency may be somewhat less than 100% due to losses in the switch module 204. However, these losses may be low and substantially negligible.

After the reconfiguration, the LVR 220 may once again increase its impedance to further reduce the output power level beyond the 6 dB back-off output power level. As the LVR 220 increases its impedance to control the Vcc provided to the PA blocks 208 and 212 from 1.8 V on down, the resulting supply drive efficiency will drop, as shown by line 320. Thus, the first configuration may be used to provide the output RF signal, RFout, with a first range of output power, while the second configuration may be used to provide the output RF signal, RFout, with a second range of output power. The ranges may be adjacent, non-overlapping ranges.

As can be seen from FIG. 2, the DC and RF terminals of the PA blocks 208 and 212 are completely decoupled from one another. This allows the coupling of the DC supply with the PA blocks 208 and 212 to be reconfigured independently of the coupling of the RF signal with the PA blocks 208 and 212. Across the reconfiguration points, the value of Vcc provided to each of the PA blocks 208 and 212 will remain unchanged, as seen by line 312 of chart 304. What changes is simply the manner in which Vcc is derived. Thus, there will be no significant change in the RF transmission characteristics, e.g., phase and frequency, provided by the PA 200 across these reconfiguration points. This may allow the switching to be done completely internal to the PA 200, without any need to involve the baseband, e.g., main processor 124, or transceiver, e.g., TX/RX circuitry 120. Also, since only DC voltages are switched, the use of expensive RF switches, which may be associated with non-linearities in the RF transmission characteristics, may be avoided.

In the output power range between the full power level to the 6 dB back-off output power level, the efficiency of the PA 200 may be the same as a conventional single PA architecture, shown by line 316 tracking line 320 from 0-6 dB. However, in the reduced output power range that is below the 6 dB back-off output power level, the current consumed by the PA 200 is reduced by 50% compared to the current consumed by the prior art PA. The supply drive efficiency is thus doubled at all power levels below the reconfiguration point.

Figure 4:
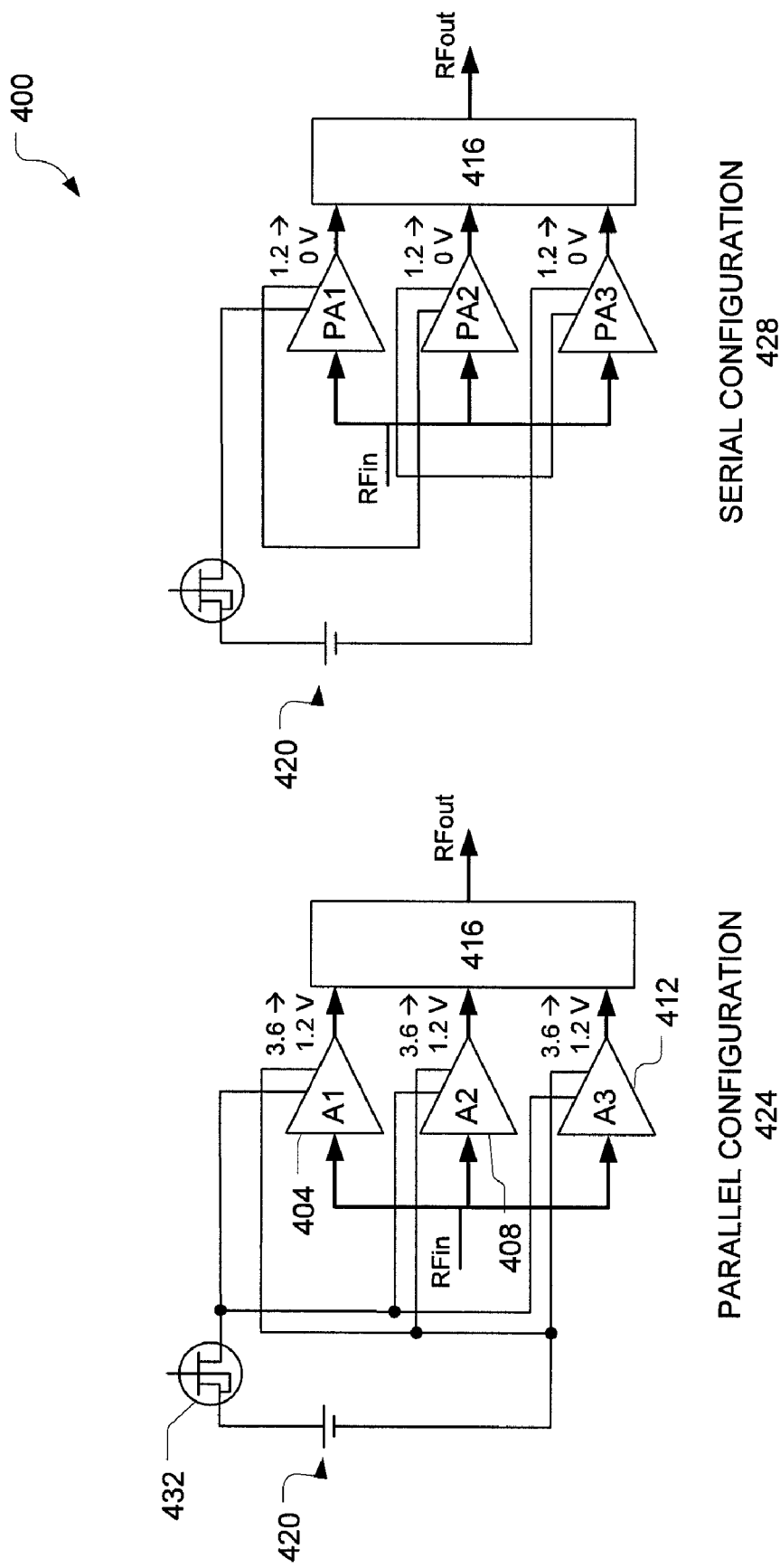
FIG. 4 illustrates DC reconfiguration options of a PA in accordance with some embodiments.

FIG. 4 illustrates DC reconfiguration options of a PA 400 having three PA blocks in accordance with some embodiments. The PA 400 may have PA blocks 404, 408 and 412 and combiner 416. The PA blocks 404, 408, and 412 may be coupled with a DC power supply 420 in a parallel configuration 424 or a serial configuration 428, as controlled by a switch module (not shown) depending on the desired output power level.

The Vcc supplied to the PA blocks 404, 408 and 412 may be controlled by an LVR 432. While in the parallel configuration 424, the LVR 432 may control the Vcc supplied to the PA blocks 404, 408 and 412 between a full power level that corresponds to Vbat, e.g., 3.6 V, and approximately Vbat/3, e.g., 1.2 V, to provide a first range of output power levels. At this reconfiguration point, the combined output power level may be reduced by $20*\log(1/3) \approx -9.54$ dB from a full power level.

Figure 5:
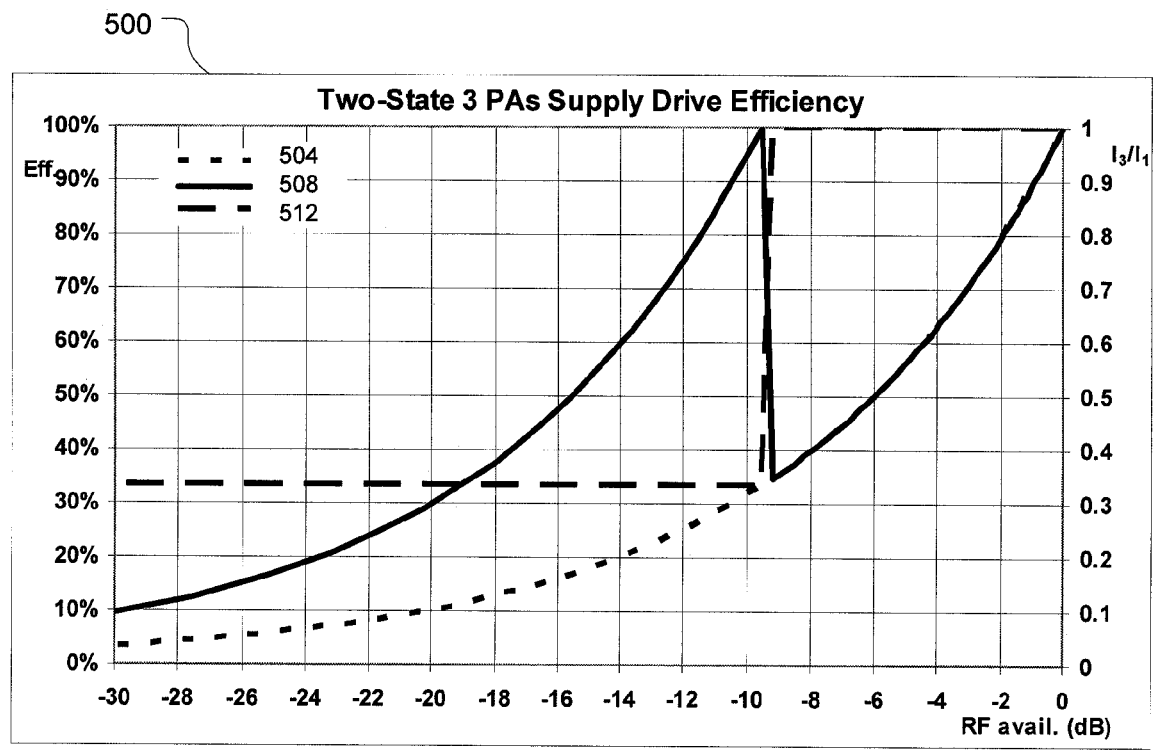
FIG. 5 provides a chart depicting operating characteristics of a PA in accordance with some embodiments.

FIG. 5 shows a chart 500 plotting various supply drive efficiencies. The chart 500 includes line 504 plotting supply drive efficiencies of a prior art PA, similar to line 316; line 508 plotting supply drive efficiencies of the PA 400; and line 512 plotting a ratio of current consumed by the PA 400 to current consumed by a prior art PA. As can be seen, from a range of approximately the full output power level to a back-off output power level of approximately 9.54 dB, the supply drive efficiency of the PA 400 may be similar to that of the prior art PA. However, at the 9.54 dB back-off output power level, which may serve as the reconfiguration point, the supply drive efficiency of the PA 400 may be increased from approximately 33% to 100%. Below the reconfiguration point, the net current of the PA 400 is reduced to one third of that of the prior art PA and the efficiency is approximately three times greater.

The plot of Vcc as a function of output power for the PA 400 may be similar to the line 312 of chart 304.

Figure 6:
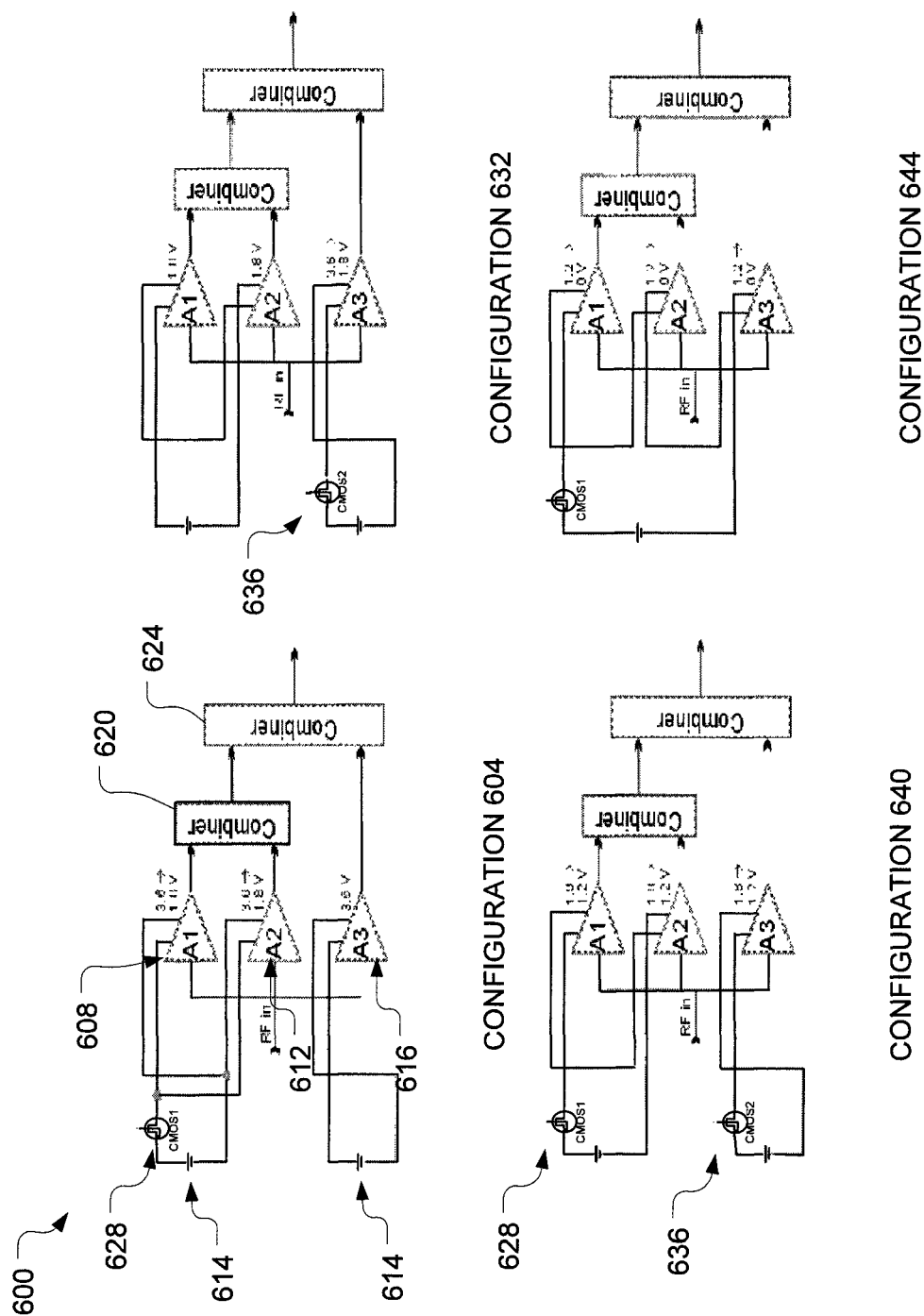
FIG. 6 illustrates DC reconfiguration options of a PA in accordance with some embodiments.

FIG. 6 illustrates DC reconfiguration options for a PA 600 that has three PA blocks in accordance with some embodiments. In configuration 604, PA blocks 608 and 612 may be coupled with a power supply 614 in a parallel manner. PA block 616 may also be coupled with the power supply 614. The outputs of the PA blocks 608, 612, and 616 may be combined through a pair of combiners 620 and 624, as shown. The Vcc supplied to the PA blocks 608 and 612 may be controlled by an LVR 628. The LVR 628 may control the Vcc supplied to the PA blocks 608 and 612 between full power, e.g., 3.6 V, and approximately Vbat/2, e.g., 1.8 V, in order to provide a first range of output power levels.

When Vcc equals Vbat/2, a switch module (not shown) may switch states to provide configuration 632. In configuration 632, an LVR 636 may reduce the Vcc supply to PA block 616 to Vbat/2 to provide a second range of output power levels. When the PA block 616 is reduced to Vbat/2, and further reduction of the output power level is desired, the switch module may switch states to provide configuration 640.

In configuration 640, the switch module may couple the PA blocks 608 and 612 with the power supply 614 in series. The switch module may couple the PA block 616 with the power supply 614 independently from the PA blocks 608 and 612. In this configuration, both LVRs 628 and 636 may control Vcc supplied to respective PA blocks between Vbat/2 and Vbat/3, e.g., 1.2 V, to provide a third range of output power levels. When an output power level below the third range is desired, the switch module may switch states to provide configuration 644.

In configuration 644, all of the PA blocks 608, 612, and 616 may be coupled with the power supply 614 in series. The LVR 628 may control Vcc supplied to the PA blocks 608, 612, and 616 between 1.2 V and 0 V to provide a fourth range of output power levels.

Figure 7:
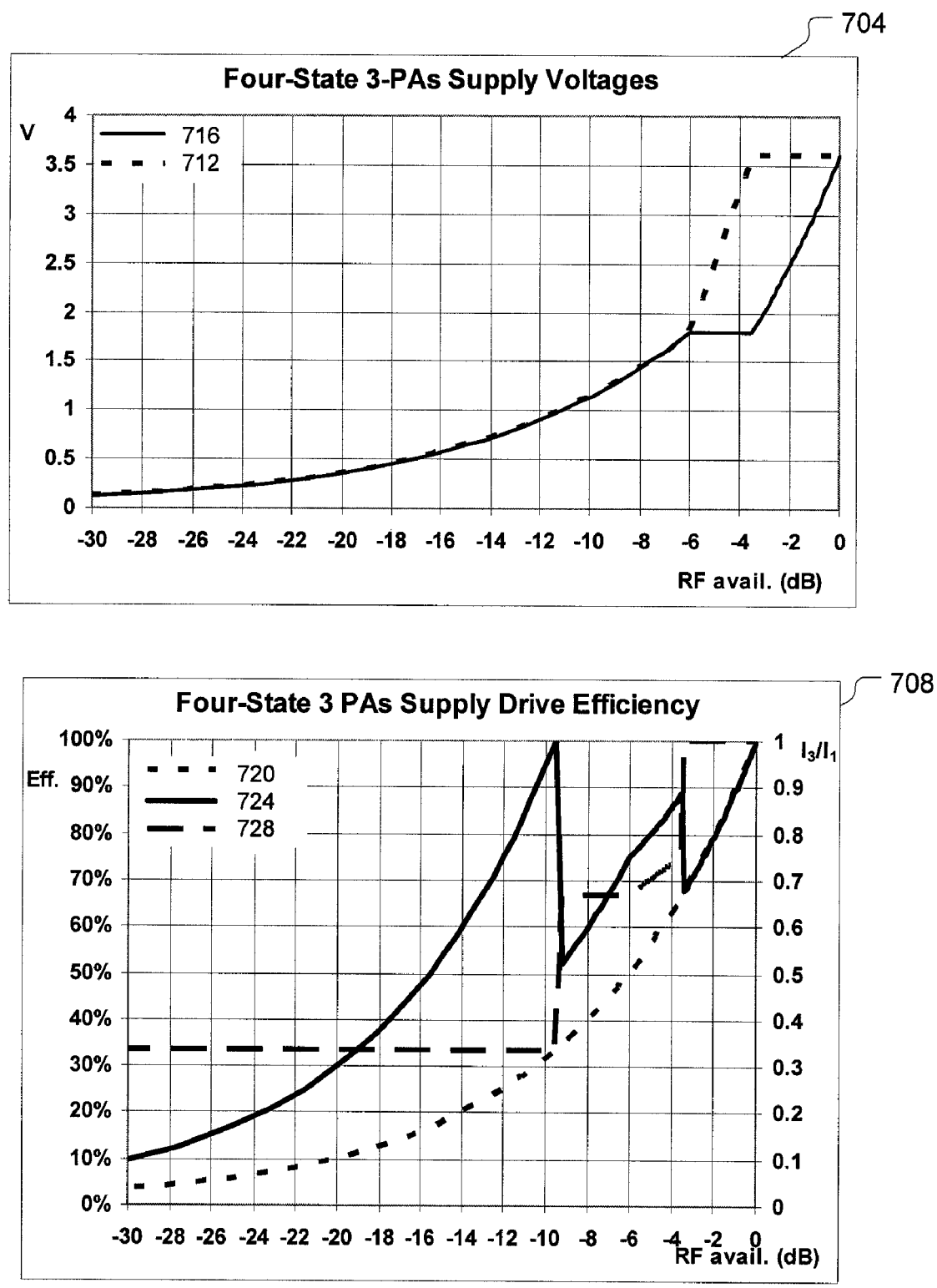
FIG. 7 provides charts depicting operating characteristics of a PA in accordance with some embodiments.

FIG. 7 includes charts 704 and 708 describing operation of the PA 600 in the four configurations described above in accordance with some embodiments. Chart 704 shows line 712 plotting Vcc of PA blocks 608 and 612 as a function of output power, and line 716 plotting Vcc of PA block 616 as a function of output power. It may be noted that the supply voltages to all the PA blocks are continuous across the reconfiguration points.

Chart 708 shows line 720 plotting a supply drive efficiency of a prior art PA; line 724 plotting a supply drive efficiency of PA 600; and line 728 plotting a ratio of current consumed by the PA 600 to current consumed by a prior art PA.

At the ~−3.4 dB and ~−9.54 dB reconfiguration points, the drive supply efficiency increases sharply with the elimination/reduction of LVR power loss. At the −95.4 dB reconfiguration point, the drive efficiency approaches 100% as in the previously described embodiment. However, at the −3.4 dB reconfiguration point, the supply drive efficiency may only jump up to ~88.9%. This may be due to a difference between the power outputs of the various PA blocks at the reconfiguration point. For example, at the −3.4 dB reconfiguration point, the Vcc on the PA blocks 608 and 612 may be ~1.8 V, while the Vcc on the PA block 616 may be ~3.6 V. This may result in a power difference of ~6 dB between the output of the PA block 616 and the combiner 620. The passive network of the combiner 624 used to combine the outputs of the combiner 620 and the PA block 616 may be designed to combine multi-inputs of equal amplitude. When it is presented with such a power difference, a finite transmission loss may result due to incident energy being reflected and coupled between its inputs, instead of being directed towards the output.

Figure 8:
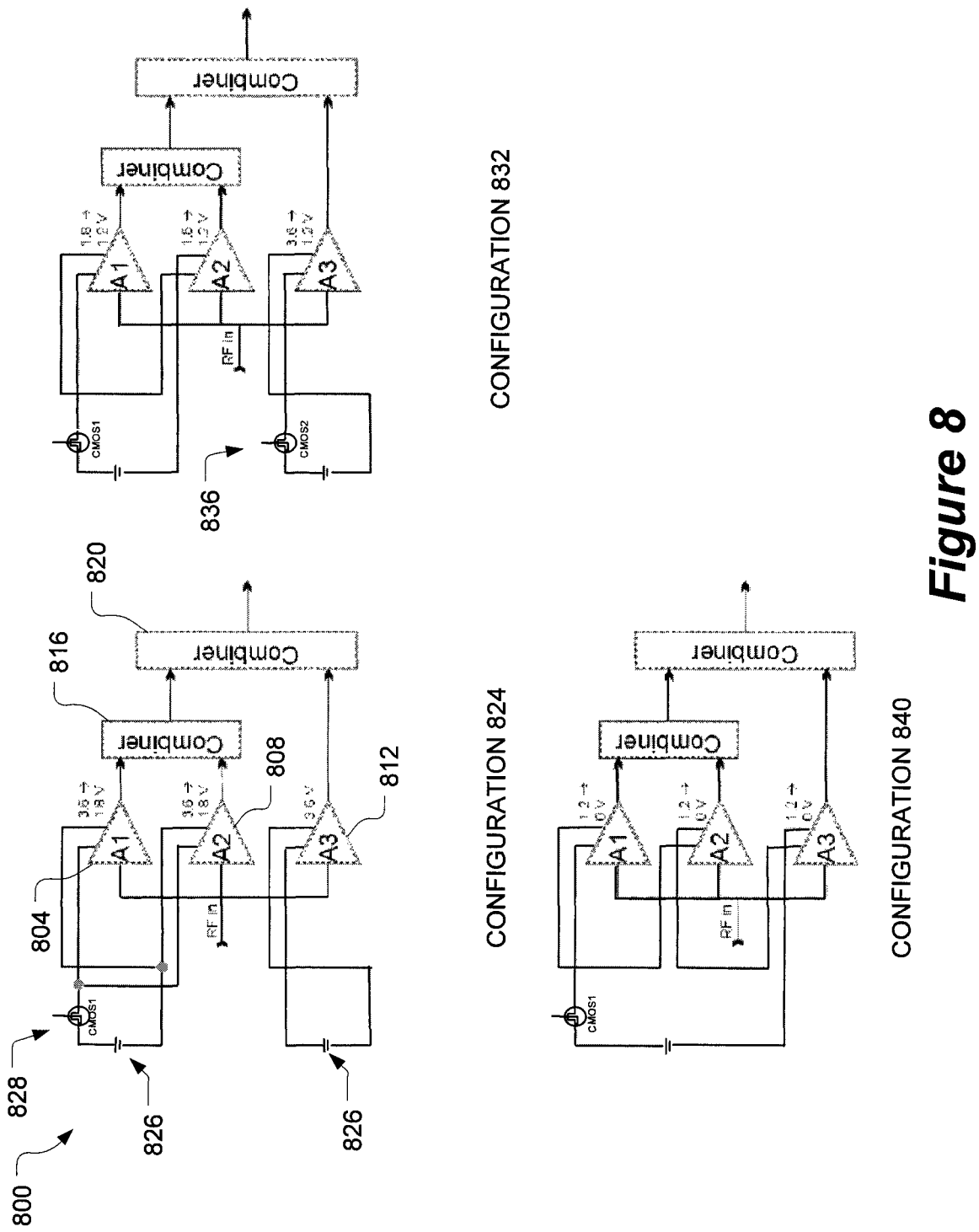
FIG. 8 illustrates DC reconfiguration options of a PA in accordance with some embodiments.

FIG. 8 illustrates DC reconfiguration options of a PA 800 that includes three PA blocks in accordance with some embodiments. The PA 800 may have components similar to PA 600, e.g., three PA blocks 804, 808, and 812, and two combiners 816 and 820.

In configuration 824, the PA blocks 804 and 808 may be coupled, in parallel, with a power supply 826. PA block 812 may also be coupled with the power supply 826. The Vcc supplied to the PA blocks 804 and 808 may be controlled by an LVR 828. The LVR 828 may control the Vcc supplied to the PA blocks 804 and 808 between Vbat, e.g., 3.6 V, and approximately Vbat/2, e.g., 1.8 V, to provide a first range of output power levels. When Vcc for the PA blocks 804 and 808 is approximately Vbat/2, a switch module (not shown) may switch states to provide configuration 832.

In configuration 832, an LVR 836 may reduce the Vcc supply to the PA block 812 to Vbat/3, e.g., 1.2 V, and the LVR 828 may take the Vcc supplied to the PA blocks 804 and 808 down to Vbat/3, to provide a second range of output power levels. When all the PA blocks 804, 808, and 812 are reduced to Vbat/3, and further output power reduction is desired, the switch module may switch states to provide configuration 840.

In configuration 840, the switch module may couple all of the PA blocks with the power supply 826 in series. The LVR 828 may control the Vcc supplied to the PA blocks between 1.2 V and 0 V.

Figure 9:
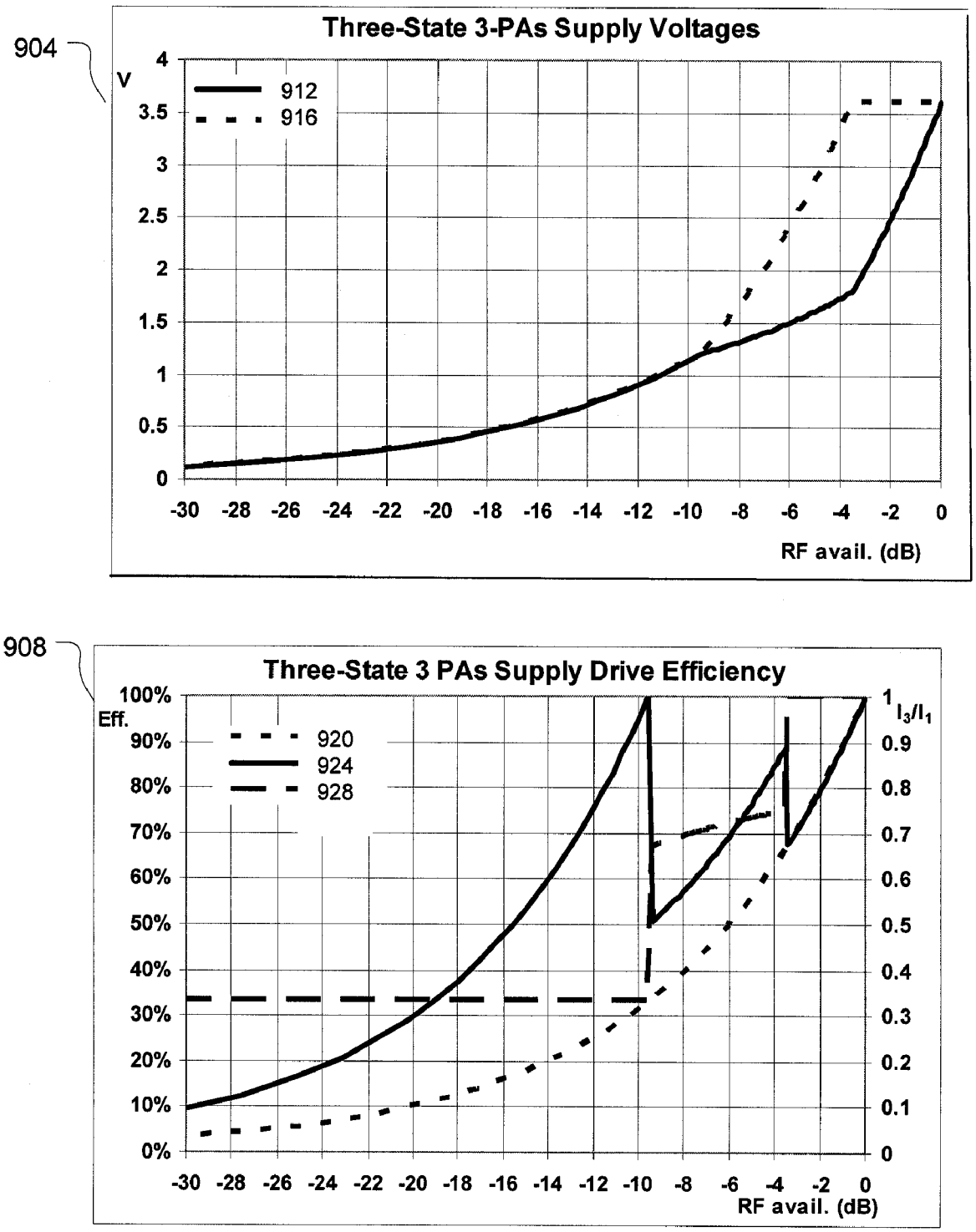
FIG. 9 provides charts depicting operating characteristics of a PA in accordance with some embodiments.

FIG. 9 includes charts 904 and 908 describing operation of the PA 800 in accordance with some embodiments.

Chart 904 shows line 912 plotting Vcc of the PA blocks 804 and 808 as a function of output power, and line 916 plotting Vcc of the PA block 812 as a function of output power. Similar to the above-described embodiments, the supply voltages to all the PA blocks 804, 808, and 812 in these embodiments are continuous across the reconfiguration points.

Figure 10:
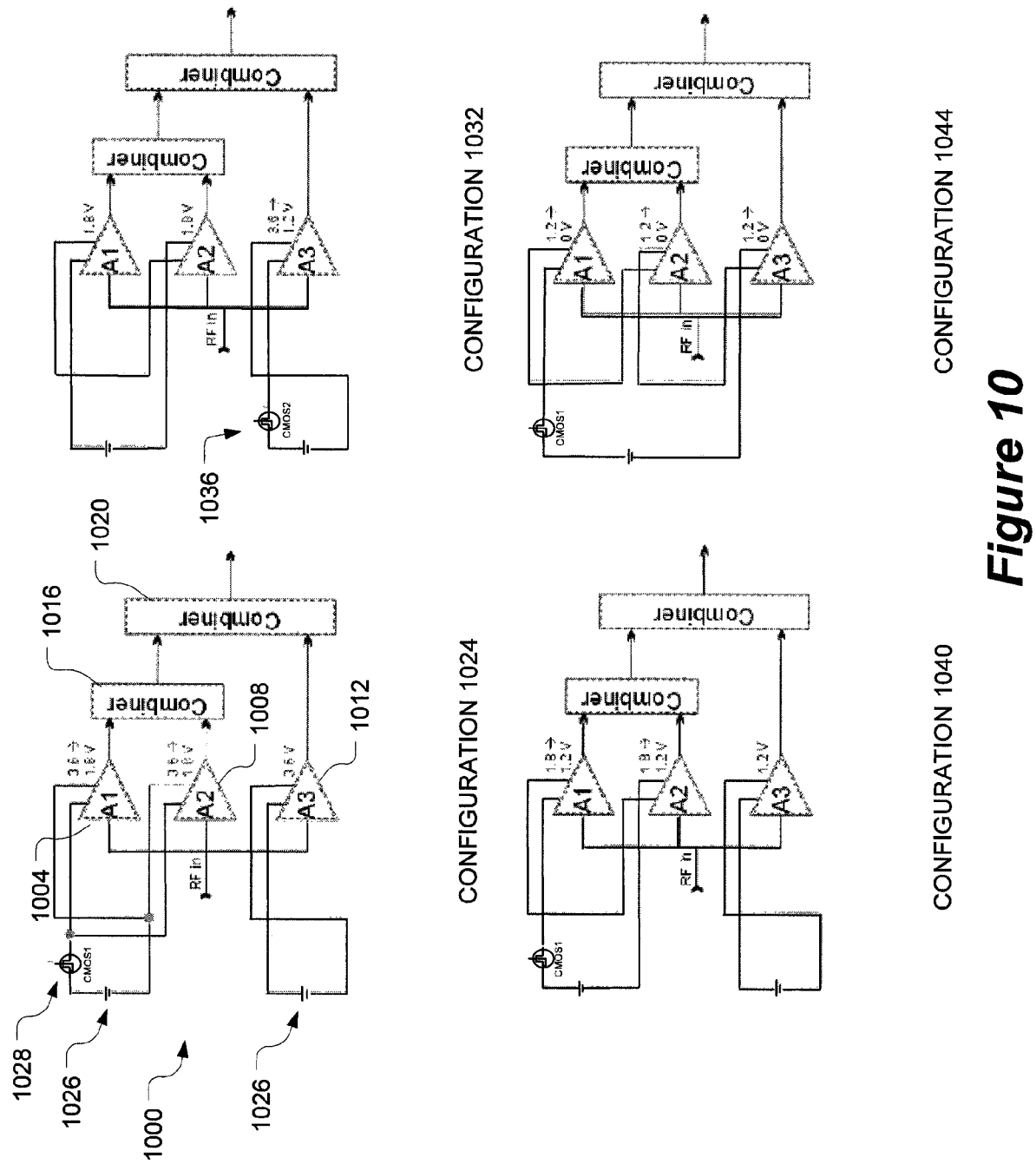
FIG. 10 illustrates DC reconfiguration options of a PA in accordance with some embodiments.

Chart 908 shows line 920 plotting a supply drive efficiency of a prior art PA; line 924 plotting a supply drive efficiency of PA 800; and line 928 plotting a ratio of current consumed by the PA 800 to current consumed by a prior art PA. FIG. 10 illustrates DC reconfiguration options of a PA 1000 that includes three PA blocks in accordance with some embodiments. The PA 1000 may have components similar to PAs 600 and 800, e.g., three PA blocks 1004, 1008, and 1012, and two combiners 1016 and 1020.

In configuration 1024, the PA blocks 1004 and 1008 may be coupled, in parallel, with a power supply 1026. The PA block 1012 may also be coupled with the power supply 1026. The Vcc supplied to the PA blocks 1004 and 1008 may be controlled by an LVR 1028. The LVR 1028 may control the Vcc supplied to the PA blocks 1004 and 1008 between Vbat, e.g., 3.6 V, and approximately Vbat/2, e.g., 1.8 V, to provide a first range of output power levels. When Vcc for PA blocks 1004 and 1008 is approximately Vbat/2, a switch module (not shown) may switch states to provide configuration 1032.

In configuration 1032, an LVR 1036 may reduce the Vcc supply to PA block 1012 to Vbat/3, e.g., 1.2 V, to provide a second range of output power levels. When the PA block 1012 is reduced to Vbat/3, and further output power reduction is desired, the switch module may switch states to provide configuration 1040.

In configuration 1040, the LVR 1028 may control the Vcc that is serially supplied to PA blocks 1004 and 1008 between Vbat/2 and approximately Vbat/3, to provide a third range of output power levels. When all the PA blocks are at Vbat/3, and further output power reduction is desired, the switch module may switch states to provide configuration 1044.

In configuration 1044, the switch module may couple all of the PA blocks 1004, 1008, and 1012 with the power supply 1026 in series. The LVR 1028 may control Vcc supplied to the PA blocks between Vbat/3, e.g., 1.2 V, and 0 V, to provide a fourth range of output power levels.

Figure 11:
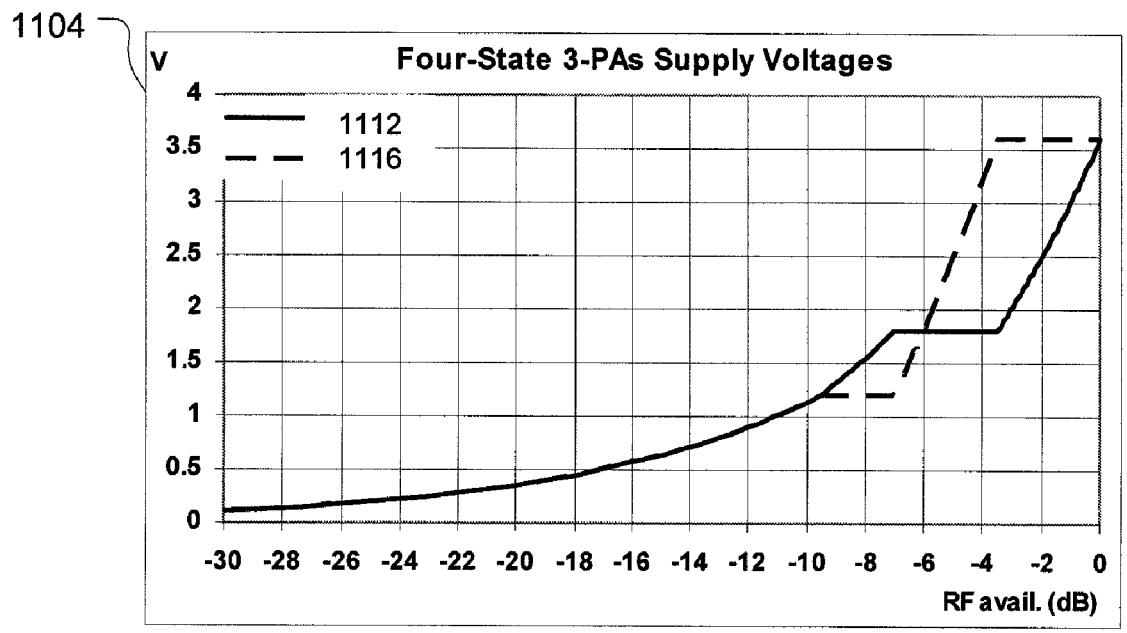
FIG. 11 provides charts depicting operating characteristics of a PA in accordance with some embodiments.
Figure 11:
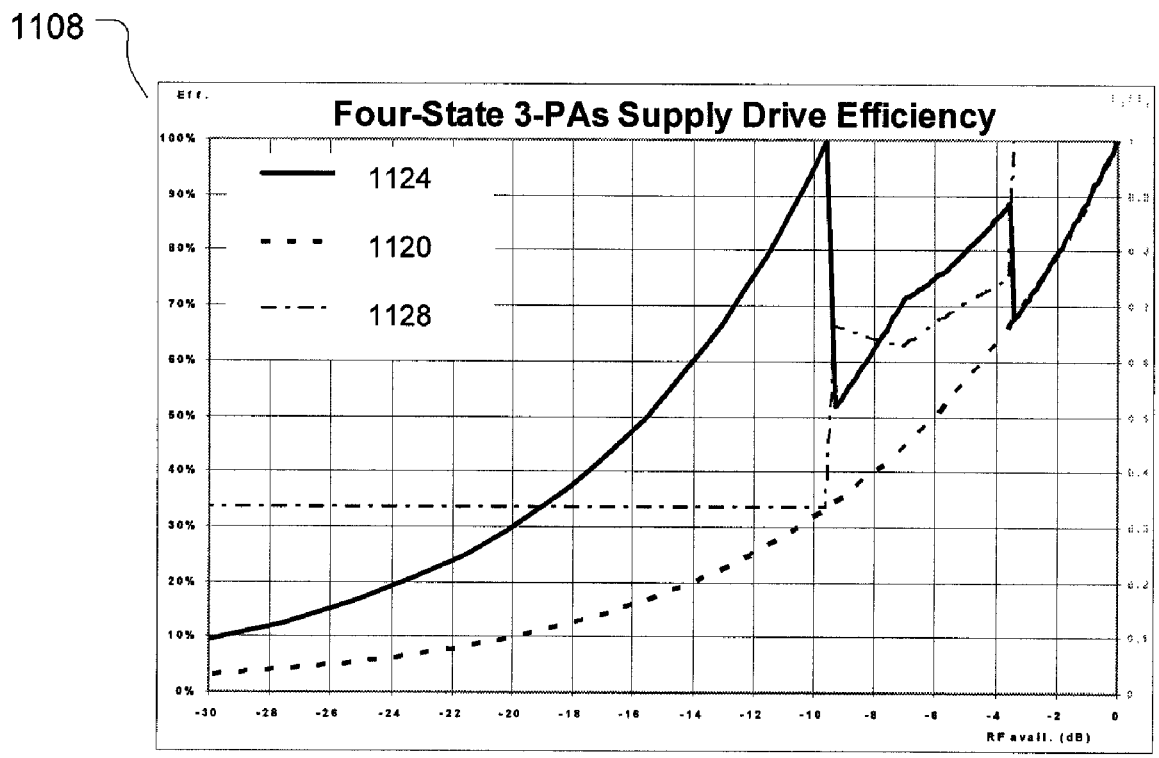

FIG. 11 includes charts 1104 and 1108 describing operation of the PA 1000 in accordance with some embodiments.

Chart 1104 shows line 1112 plotting Vcc of PA blocks 1004 and 1008 as a function of output power, and line 1116 plotting Vcc of PA block 1012 as a function of output power. Similar to the above-described embodiments, the supply voltages to all the PA blocks 1004, 1008, and 1012 in these embodiments are continuous across the reconfiguration points.

Chart 1108 shows line 1120 plotting a supply drive efficiency of a prior art PA; line 1124 plotting a supply drive efficiency of PA 1000; and line 1128 plotting a ratio of current consumed by the PA 1000 to current consumed by a prior art PA.

Figure 12:
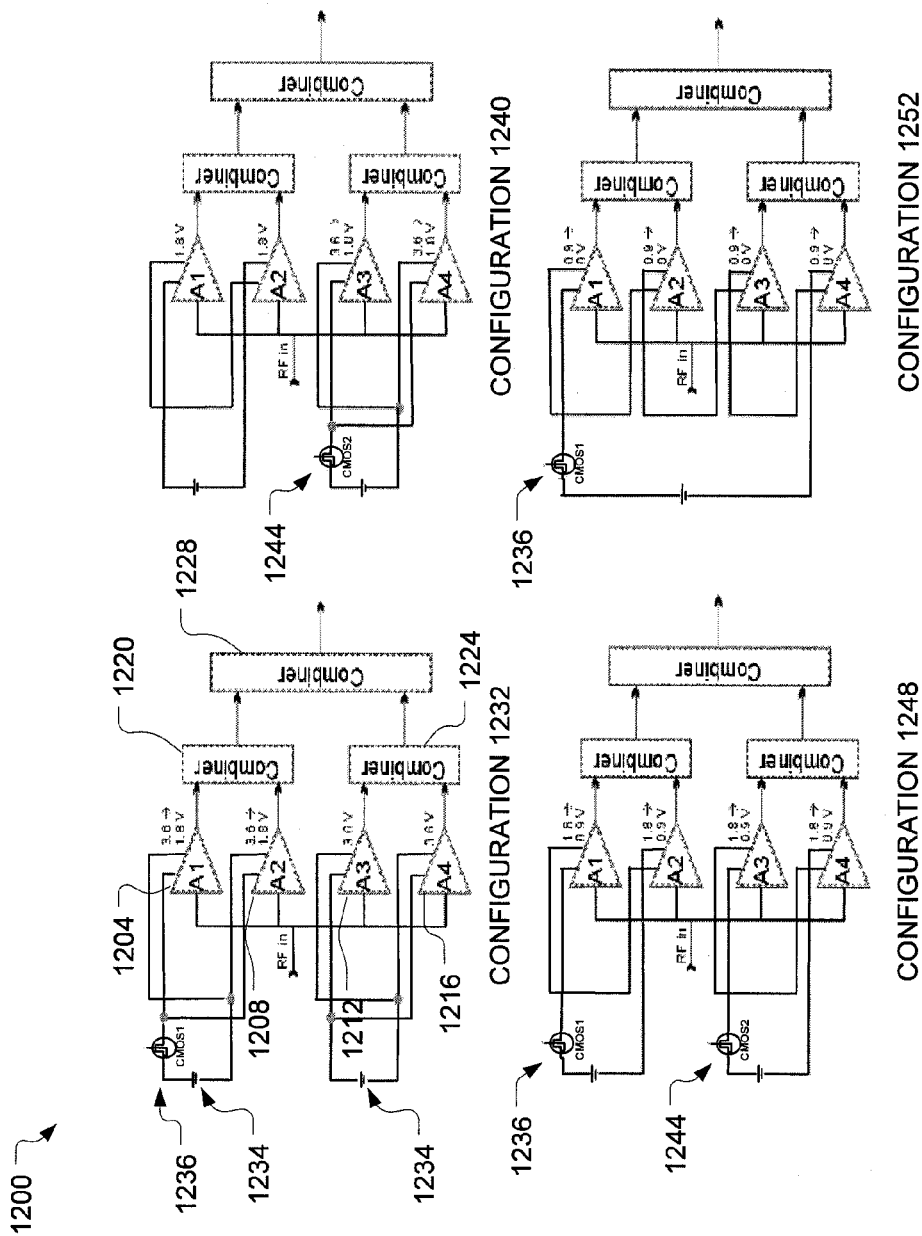
FIG. 12 illustrates DC reconfiguration options of a PA in accordance with some embodiments.

FIG. 12 illustrates DC configuration options of PA 1200 in accordance with some embodiments. The PA 1200 has four PA blocks 1204, 1208, 1212, and 1216 and three combiners 1220, 1224, and 1228 to combine the outputs of the PA blocks 1204, 1208, 1212, and 1216 as shown.

In configuration 1232, all of the PA blocks 1204, 1208, 1212, and 1216 may be coupled, in parallel, with a power supply 1234. An LVR 1236 may control a Vcc supplied to the PA blocks 1204 and 1208 between Vbat, e.g., 3.6 V, and Vbat/2, e.g., 1.8 V, to provide a first range of output power levels. If further output power reduction is desired, a switch module (not shown) may switch states to provide configuration 1240.

In configuration 1240, an LVR 1244 may control a Vcc supplied to the PA blocks 1212 and 1216 between Vbat, e.g., 3.6 V, and Vbat/2, e.g., 1.8 V, to provide a second range of output power levels. If further output power reduction is desired, the switch module may switch states to provide configuration 1248.

In configuration 1248, the PA blocks 1204 and 1208 may be coupled with the power supply 1234 in series with one another. Likewise, PA blocks 1212 and 1216 may be coupled with the power supply 1234 in series with one another. The LVRs 1236 and 1244 may control the Vcc supplied to PA blocks 1204 and 1208 and to PA blocks 1212 and 1216, respectively, between Vbat/2, e.g., 1.8 V, and Vbat/4, e.g., 0.9 V, to provide a third range of output power levels. If further output power reduction is desired, the switch module may switch states to provide configuration 1252.

In configuration 1252, all of the PA blocks 1204, 1208, 1212, and 1216 may be coupled with the power supply 1234 in series with one another. The LVR 1236 may control Vcc supplied to the PA blocks 1204, 1208, 1212, and 1216 between Vbat/4, e.g., 0.9 V, and 0 V, to provide a fourth range of output power levels.

Figure 13:
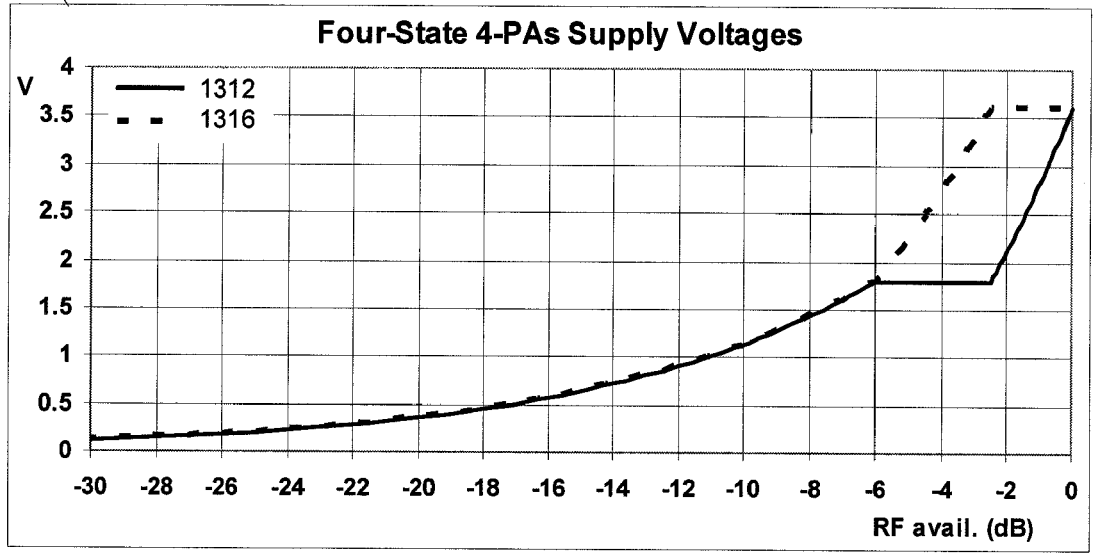
FIG. 13 provides charts depicting operating characteristics of a PA in accordance with some embodiments.
Figure 13:
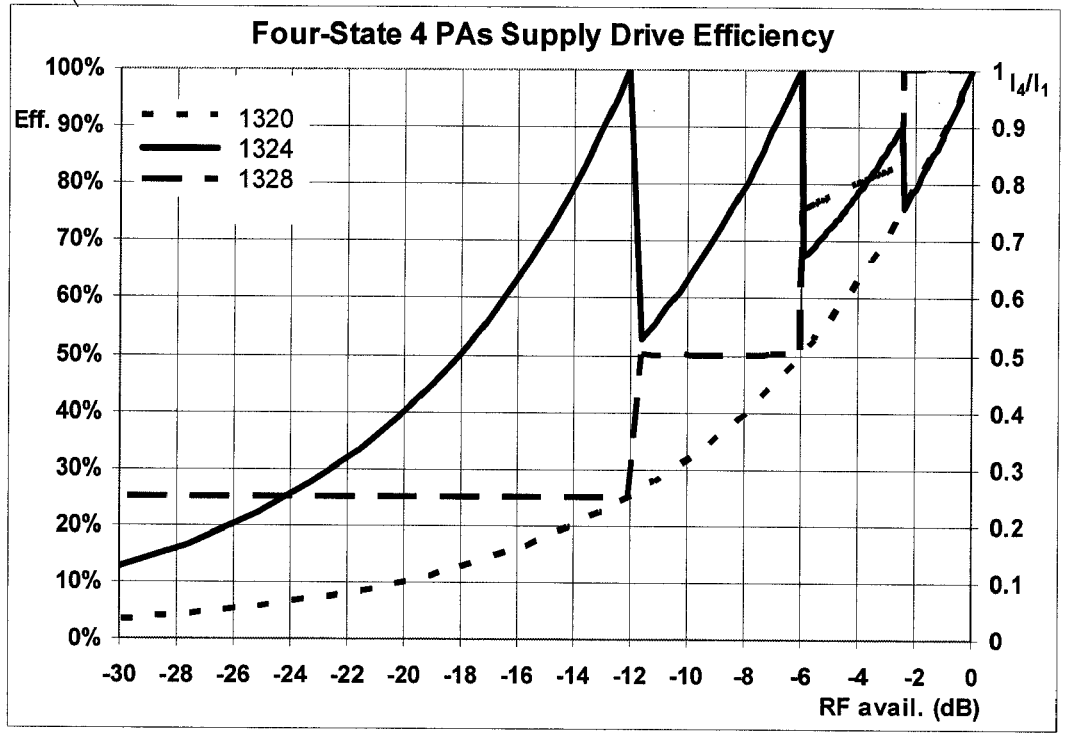

FIG. 13 includes charts 1304 and 1308 describing operation of the PA 1200 in accordance with some embodiments.

Chart 1304 shows line 1312 plotting Vcc of PA blocks 1204 and 1208 as a function of output power, and line 1316 plotting Vcc of PA blocks 1212 and 1216 as a function of output power. Similar to the above-described embodiments, the supply voltages to all the PA blocks 1204, 1208, 1212, and 1216 in these embodiments are continuous across the reconfiguration points. Chart 1308 shows line 1320 plotting a supply drive efficiency of a prior art PA; line 1324 plotting a supply drive efficiency of PA 1200; and line 1328 plotting a ratio of current consumed by the PA 1200 to current consumed by a prior art PA.

At the first reconfiguration point, e.g., ~−2.5 dB, the output power from the PA blocks 1204 and 1208 may be less than the output power from the PA blocks 1212 and 1216. This imbalance, similar to those discussed above, may result in the supply drive efficiency being somewhat less than 100% after the first reconfiguration. At the second and third reconfiguration points, e.g., at ~−6 dB and ~−12 dB, all the PA blocks 1204, 1208, 1212, and 1216 may supply equal power and thus the supply drive efficiency may approach 100%.

Figure 14:
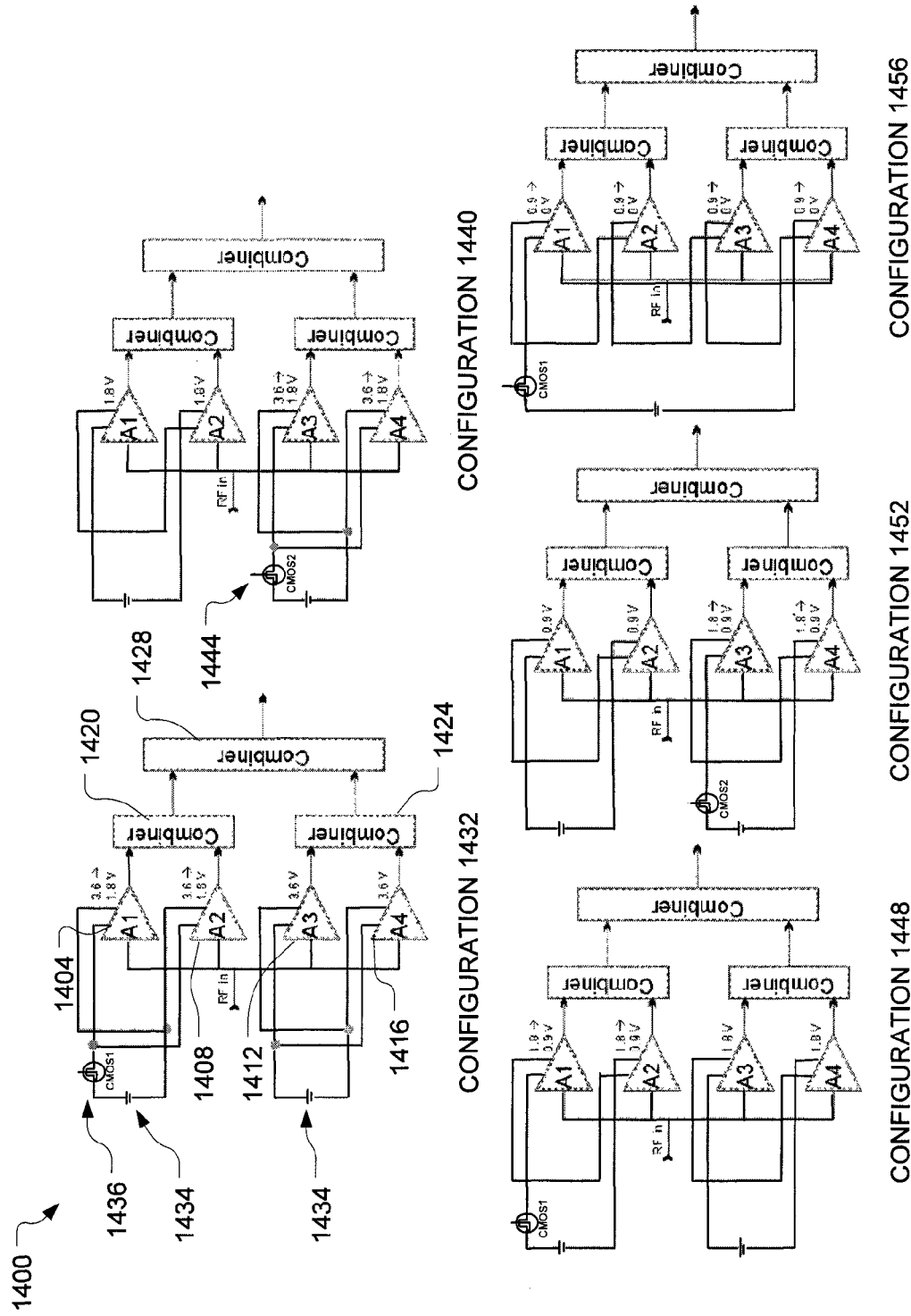
FIG. 14 illustrates DC reconfiguration options of a PA in accordance with some embodiments.

FIG. 14 illustrates DC reconfiguration options of a PA 1400 that has four PA blocks in accordance with some embodiments. The PA 1400 may have components similar to PA 1200, e.g., four PA blocks 1404, 1408, 1412, and 1416 and three combiners 1420, 1424, and 1428 to combine the outputs of the PA blocks 1404, 1408, 1412, and 1416 as shown.

In configuration 1432, all of the PA blocks 1404, 1408, 1412, and 1416 may be coupled with a power supply 1434 in a parallel manner. An LVR 1436 may control a Vcc supplied to PA blocks 1404 and 1408 between Vbat, e.g., 3.6 V, and Vbat/2, e.g., 1.8 V, to provide a first range of output power levels. If further output power reduction is desired, a switch module (not shown) may switch states to provide configuration 1440.

In configuration 1440, an LVR 1444 may control a Vcc supplied to PA blocks 1412 and 1416 between Vbat, e.g., 3.6 V, and Vbat/2, e.g., 1.8 V, to provide a second range of output power levels. If further output power reduction is desired, the switch module may switch states to provide configuration 1448.

In configuration 1448, PA blocks 1404 and 1408 may be coupled with the power supply 1434 in series with one another. Likewise, PA blocks 1412 and 1416 may be coupled with the power supply 1434 in series with one another. The LVR 1436 may control the Vcc supplied to PA blocks 1404 and 1408 between Vbat/2, e.g., 1.8 V, and Vbat/4, e.g., 0.9 V, to provide a third range of output power levels. If further output power reduction is desired, the switch module may switch states to provide configuration 1452. In configuration 1452, the LVR 1444 may control the Vcc supplied to PA blocks 1412 and 1416 between Vbat/2, e.g., 1.8 V, and Vbat/4, e.g., 0.9 V, to provide a fourth range of output power levels. If further output power reduction is desired, the switch module may switch states to provide configuration 1456.

In configuration 1456, all of the PA blocks 1404, 1408, 1412, and 1416 may be coupled with the power supply 1434 in series with one another. The LVR 1436 may control Vcc supplied to the PA blocks 1404, 1408, 1412, and 1416 between Vbat/4, e.g., 0.9 V, and 0 V, to provide a fifth range of output power levels.

Figure 15:
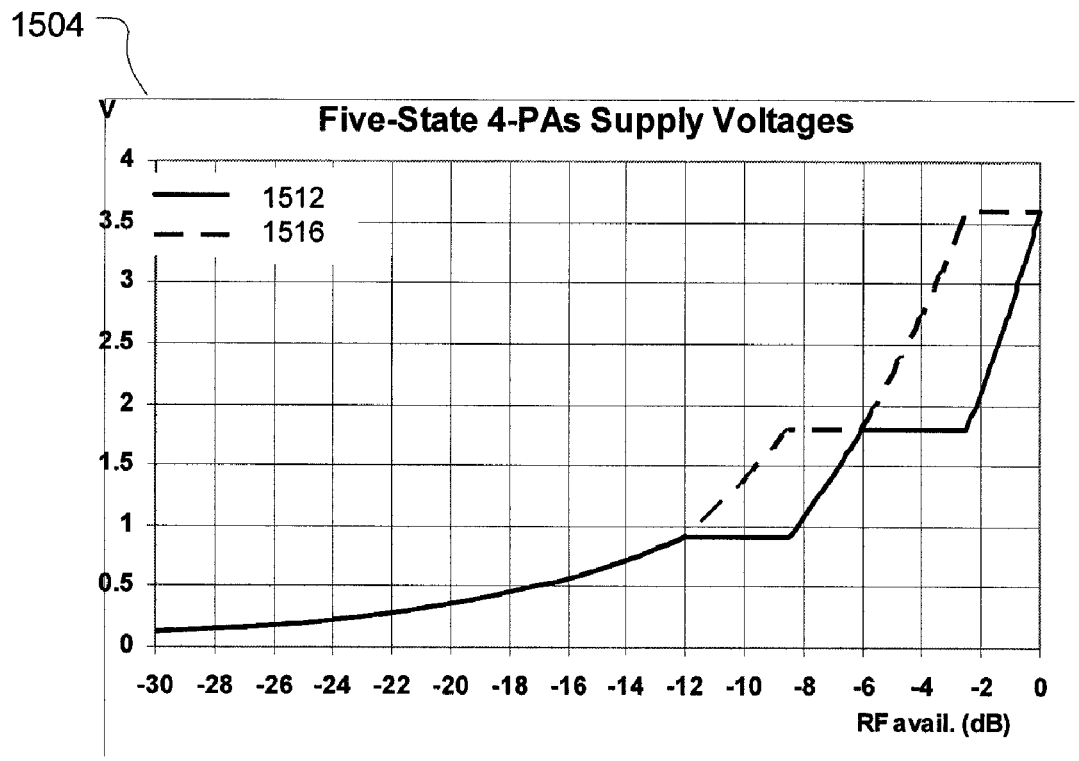
FIG. 15 provides charts depicting operating characteristics of a PA in accordance with some embodiments.
Figure 15:
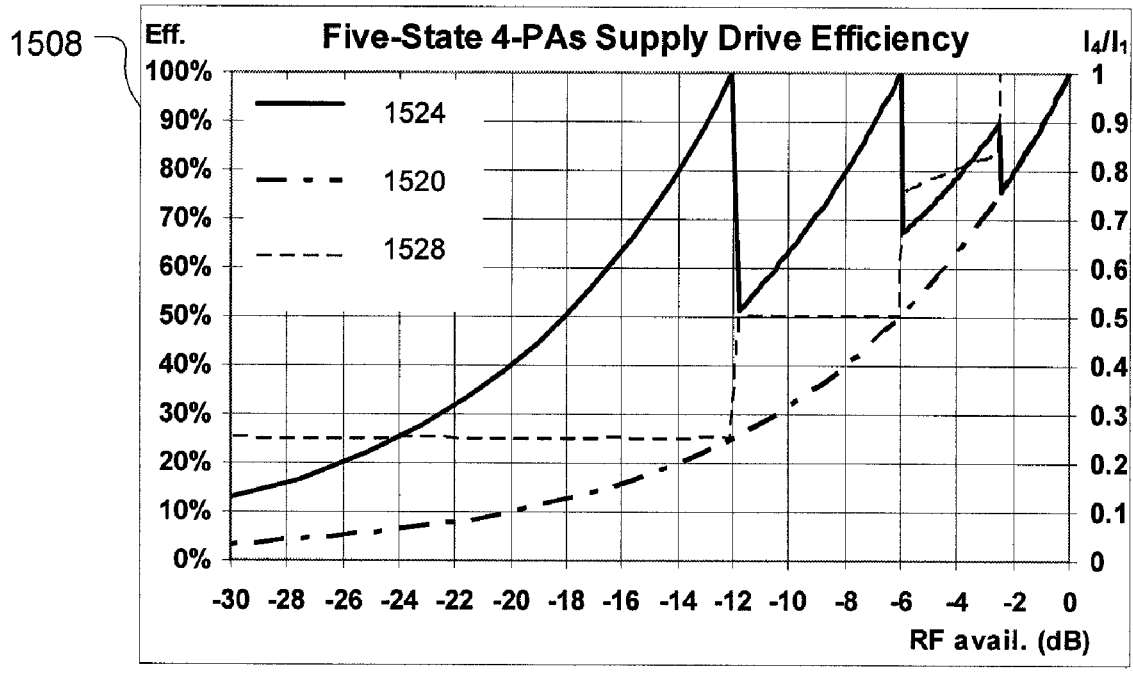

FIG. 15 includes charts 1504 and 1508 describing operation of the PA 1400 in accordance with some embodiments.

Chart 1504 shows line 1512 plotting Vcc of PA blocks 1404 and 1408 as a function of output power, and line 1516 plotting Vcc of PA blocks 1412 and 1416 as a function of output power. Similar to the above-described embodiments, the supply voltages to all the PA blocks 1404, 1408, 1412, and 1416 in these embodiments are continuous across the reconfiguration points. Chart 1508 shows line 1520 plotting a supply drive efficiency of a prior art PA; line 1524 plotting a supply drive efficiency of PA 1400; and line 1528 plotting a ratio of current consumed by the PA 1400 to current consumed by a prior art PA.

As can be seen, embodiments of the present disclosure provide the opportunity for significant improvement in back-off efficiency of the wireless transmission device 100 by providing reconfigurable DC coupling for the PA 132. The figures to follow will provide some possible implementations for the PA 132 in accordance with various embodiments.

Figure 16:
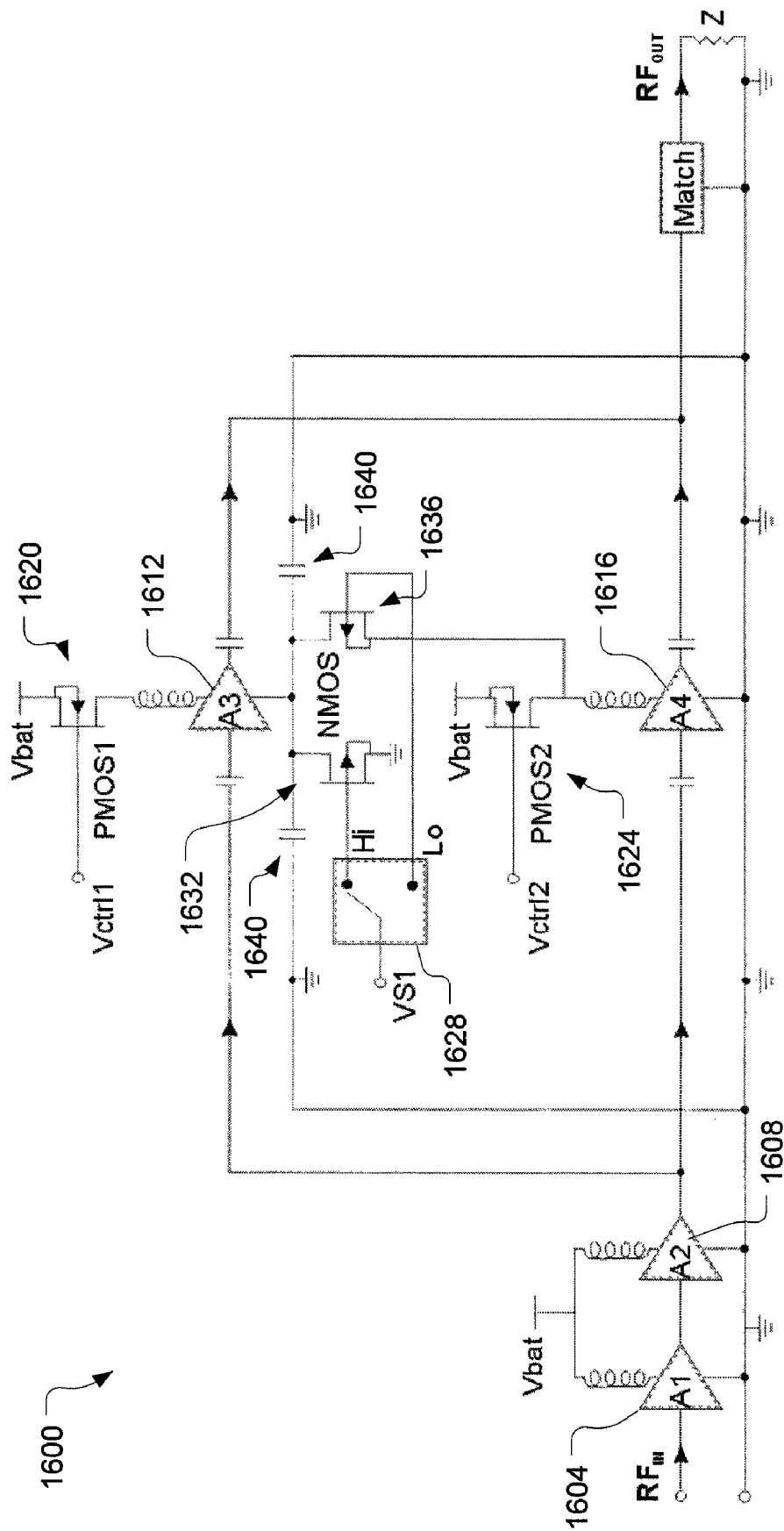
FIGS. 16-22 illustrate various PAs in more detail in accordance with various embodiments.

FIG. 16 illustrates a PA 1600 in more detail in accordance with some embodiments. The PA 1600 is a three-stage PA with PA blocks 1604, 1608, 1612, and 1616. The PA blocks 1612 and 1616 may serve as the output stage of the PA 1600 and may have a reconfigurable DC coupling as will be described. The preliminary stages, e.g., PA blocks 1604 and 1608, which may consume relatively little current compared to the output stage, may have a statically configured DC coupling. A "statically configured DC coupling," as used herein, means that the DC coupling to the PA blocks 1604 and 1608 will not change while the PA 1600 is operating.

The PA 1600 may include a PMOS1 1620 that serves as an LVR for PA block 1612; and a PMOS2 1624 that serves as an LVR for PA block 1616. PMOS1 1620 and PMOS2 1624 may be controlled by control signals Vctrl1 and Vctrl2, respectively. Even though this embodiment provides two PMOS LVRs, they each will be half the size of a single PMOS LVR used in prior art. Accordingly, the two LVRs of this embodiment require no more space than a single LVR used in prior art.

The PA 1600 may also include a switch 1628 coupled with a pair of NMOSs 1632 and 1636. The switch 1628 may be controlled by control signal VS1, which may come from switch logic of a switch module (not shown), to be in either a high state or a low state. These switch states may respectively correspond to a parallel or a serial configuration of the DC coupling of the output stages.

In a high power mode, with the switch 1628 in the high state, the base of NMOS 1632 will be high, while the base of the NMOS 1636 is low. This may turn a virtual RF ground, provided by blocking capacitors 1640 on a ground rail, into a DC ground as well. This may result in the PA blocks 1612 and 1616 being coupled with the power supply, Vbat, in a parallel configuration, similar to the parallel configuration 224 shown in FIG. 2. The output power of the PA 1600 may then be controlled by Vctrl1 and Vctrl2. When desired, the switch 1628 may switch to a low state that corresponds to a low power mode.

In the low power mode, the base of the NMOS 1632 will be low, while the base of the NMOS 1636 is high. This may result in the PA blocks 1612 and 1616 being coupled with the power supply in a series configuration, similar to serial configuration 228 of FIG. 2. The output power of the PA 1600 may then be controlled by Vctrl. In this configuration, the virtual RF ground on PA block 1612 has a non-zero DC potential.

The virtual RF ground provided by the blocking capacitors 1640 may help to decouple the DC and RF terminals of the PA 1600. This isolation of the DC and RF terminals may enable the RF power characteristics of the PA 1600 to be unchanged due to the DC reconfigurations.

Figure 17:
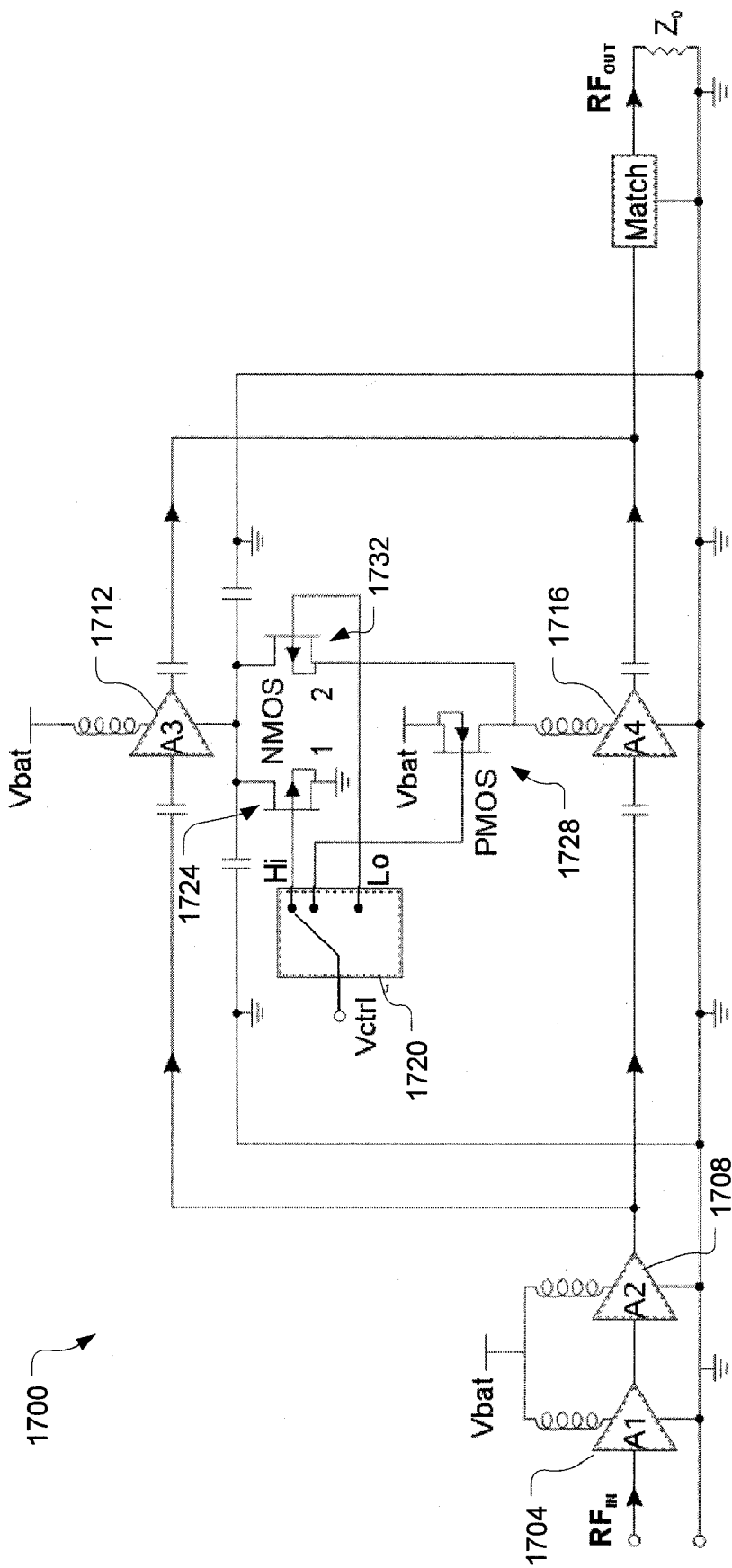

FIG. 17 illustrates a PA 1700 in more detail in accordance with some embodiments. The PA 1700 is similar to PA 1600 in that it is a three-stage PA with preliminary stages, e.g., PA blocks 1704 and 1708, having a statically configured DC coupling and the output stage, e.g., PA blocks 1712 and 1716, having a reconfigurable DC coupling. However, PA 1700 is implemented with only one PMOS LVR, e.g., PMOS 1728, as opposed to two PMOS LVRs as described above with respect to PA 1600.

While the PA 1700 is in a high-power mode, the Vcc provided to PA block 1712 may be adjusted by a switch 1720, providing a corresponding adjustment to NMOS 1724, while the Vcc provided to the PA block 1716 may be adjusted by the switch 1720, providing a corresponding adjustment to the PMOS 1728.

In the low-power mode, the switch 1720 may turn off the PMOS 1728 and NMOS 1724. The power supply, Vbat, may, therefore, be coupled with the PA blocks 1712 and 1716 in series, and the Vcc provided to the PA blocks 1712 and 1716 may be adjusted by solely adjusting the NMOS 1732. Using one PMOS, as opposed to two, may reduce the size and cost of the PA 1700.

In both PAs 1600 and 1700, a gain of the output stage may be reduced by the resistance of the blocking capacitors used to create the virtual ground. This may reduce the RF voltage applied to the output stage from the preliminary stages and may also result in negative feedback in the output stage. If this reduction/negative feedback proved to be undesirable, the implementation of FIG. 18 may be employed as an alternative.

Figure 18:
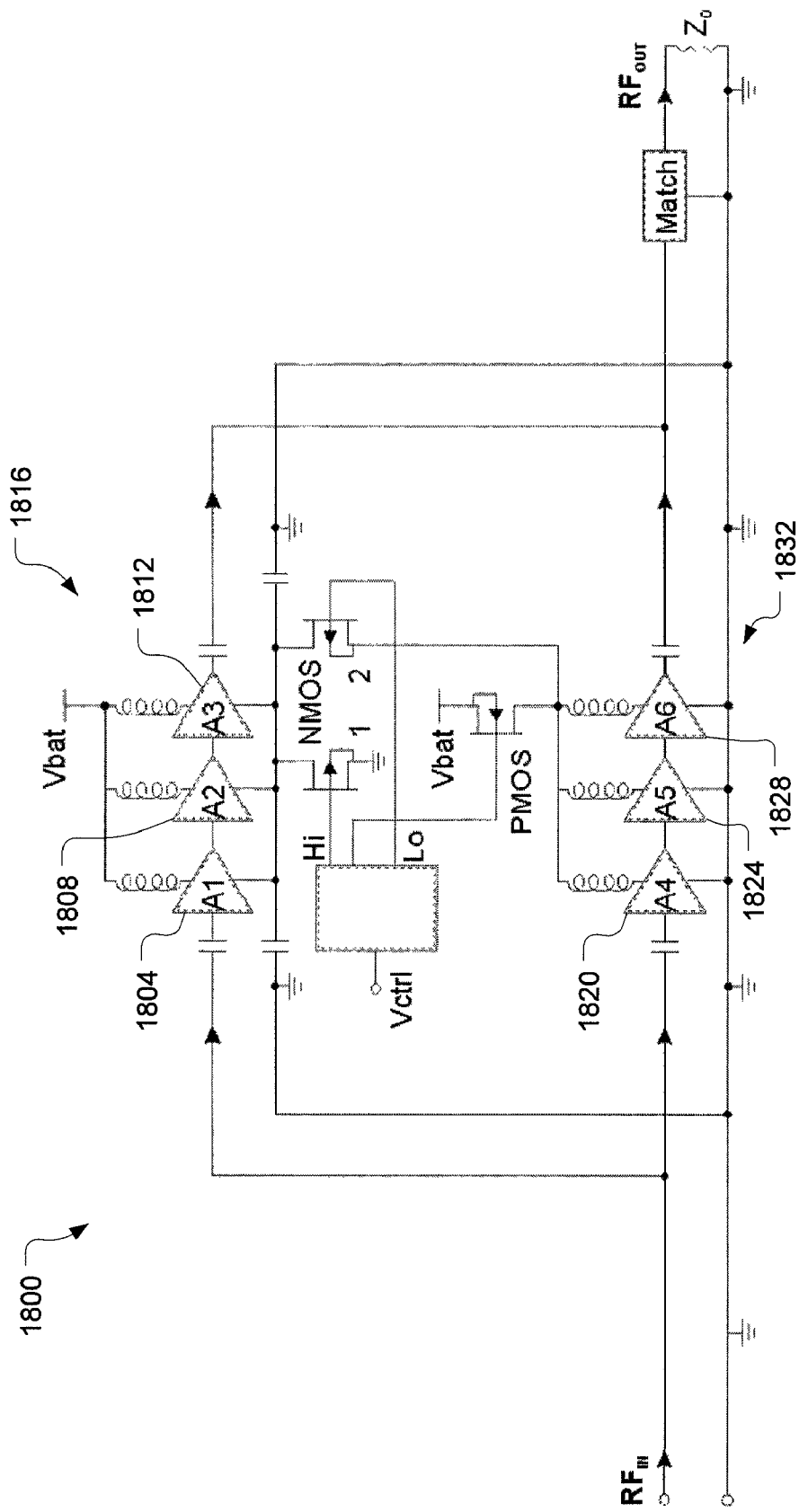

FIG. 18 illustrates a PA 1800 in accordance with some embodiments. The PA 1800 may be a three-stage PA similar to PAs 1600 and 1700. However, in this embodiment, the preliminary stages may be replicated for each branch. In particular, PA blocks 1804 and 1808 may be provided on the branch with PA block 1812. The PA blocks 1804, 1808, and 1812 may be collectively referred to as a PA chain 1816. In a similar manner, PA blocks 1820 and 1824 may be provided on the branch with the PA block 1828. The PA blocks 1820, 1824, and 1828 may be collectively referred to as a PA chain 1832. Thus, each of the stages of a particular PA chain may have a reconfigurable DC coupling and be coupled with the same RF ground as the other stages of the PA chain.

In some embodiments, an output impedance of an output stage is very low, e.g., ~2.5 ohms ($\Omega$), compared to a load that is typically 50$\Omega$. Due to the low impedance, current flowing through blocking capacitors may be high. To reduce impact on efficiency, a series resistance of the blocking capacitors may be kept very low. If this leads to undesirable effects, an implementation as shown in FIG. 19 may be employed.

Figure 19:
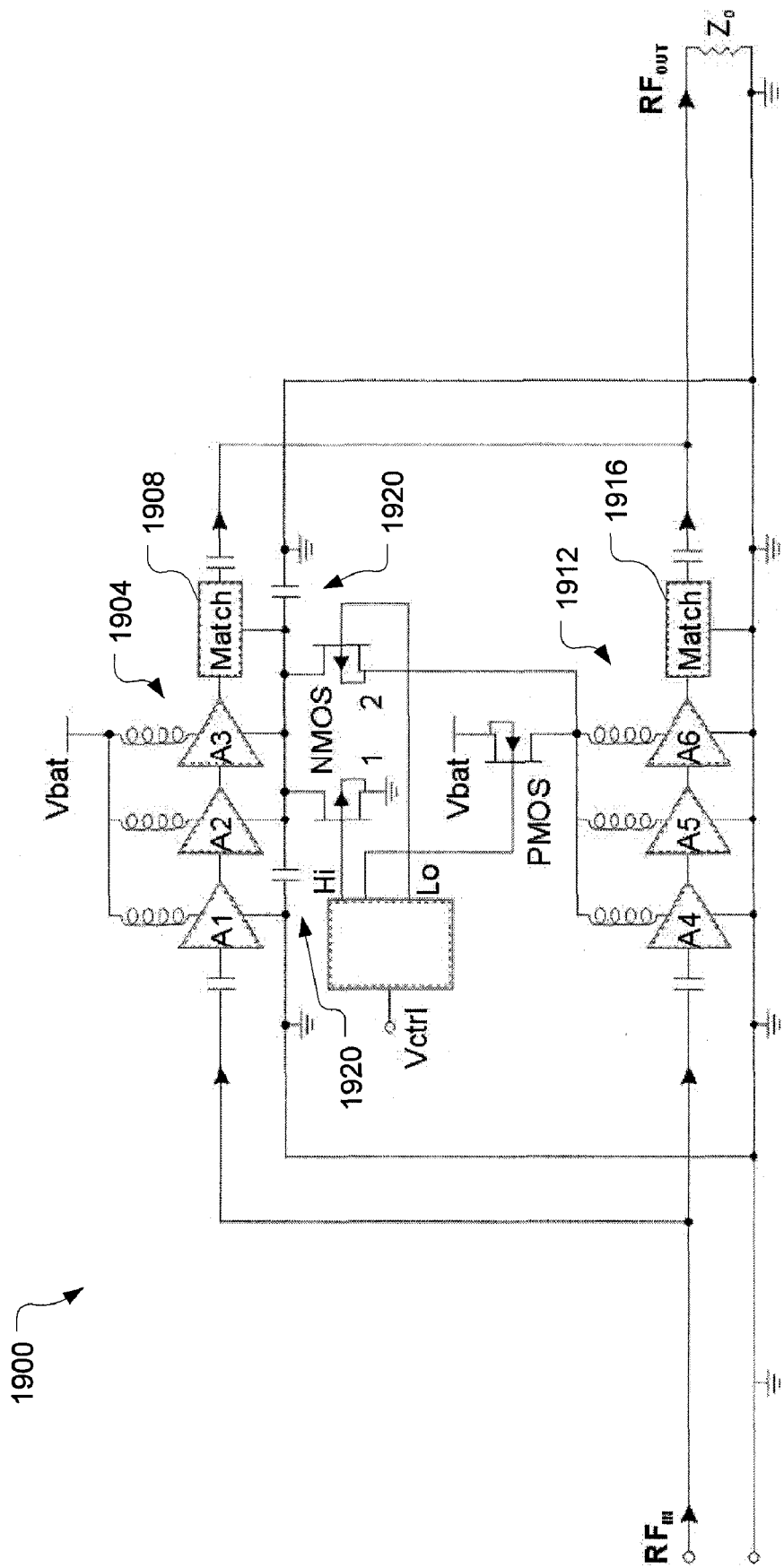

FIG. 19 illustrates a PA 1900 in accordance with some embodiments. The PA 1900 may be a three-stage PA similar to PAs 1600, 1700, and 1800. However, in this embodiment, rather than one output matching network being used for the entire PA, as is shown for the PAs 1600, 1700, and 1800, each of the PA chains may be associated with its own respective output matching networks. For example, PA chain 1904 may be associated with output matching network 1908 and PA chain 1912 may be associated with output matching network 1916.

The output matching network 1908 is brought within a virtual RF ground provided by blocking capacitors 1920. Thus, the blocking capacitors 1920 will be in a matched environment, e.g., a 50$\Omega$ environment, which may reduce an associated current flow through the blocking capacitors 1920. Assuming a series resistance of the blocking capacitors 1920 is significantly less than 50$\Omega$, the PA 1900 may experience a negligible reduction in efficiency.

Figure 20:
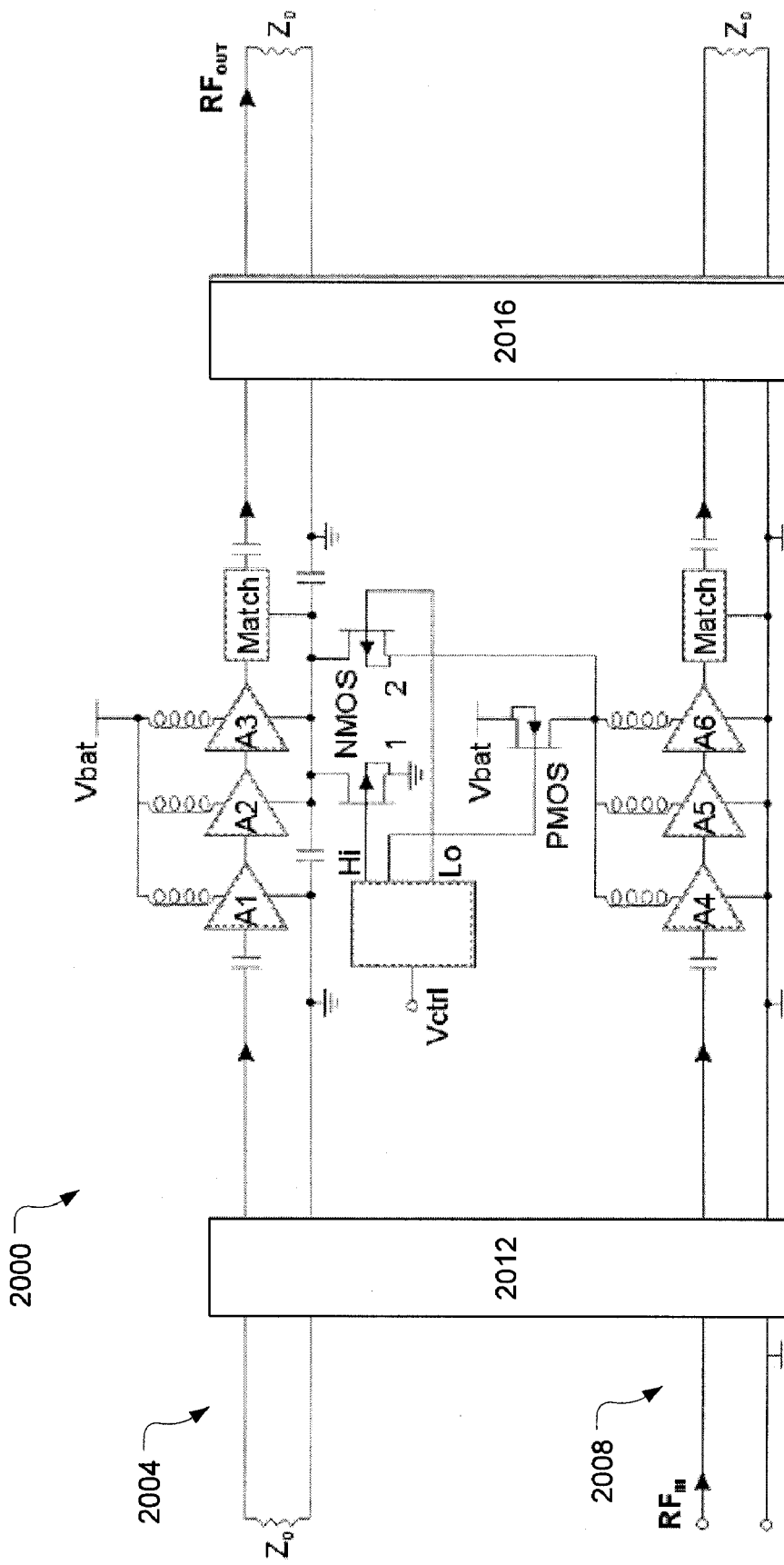

FIG. 20 illustrates a PA 2000 in accordance with some embodiments. The PA 2000 may be similar to PA 1900 in that it is a three-stage PA, with each of the stages replicated in each PA chain. However, PA 2000 further provides a balanced architecture in order to reduce sensitivity to antenna mismatch.

In particular, the PA 2000 includes a pair of parallel amplifier paths 2004 and 2008, each including a respective PA chain. The PA 2000 may also include quadrature hybrids 2012 and 2016 coupled with the amplifier paths 2004 and 2008 as shown. The quadrature hybrid 2012 may receive the input RF signal, RFin, on the amplifier path 2008, while the quadrature hybrid 2016 may output the output RF signal, RFout, on the amplifier path 2004. The reconfigurable DC supply coupling may be performed in a manner similar to any of the previously described PAs, e.g., PA 1900. As a result, balancing features may be combined with DC supply reconfiguration features, as shown, to provide both the reduced sensitivity to antenna mismatch and improved back-off efficiency.

Figure 21:
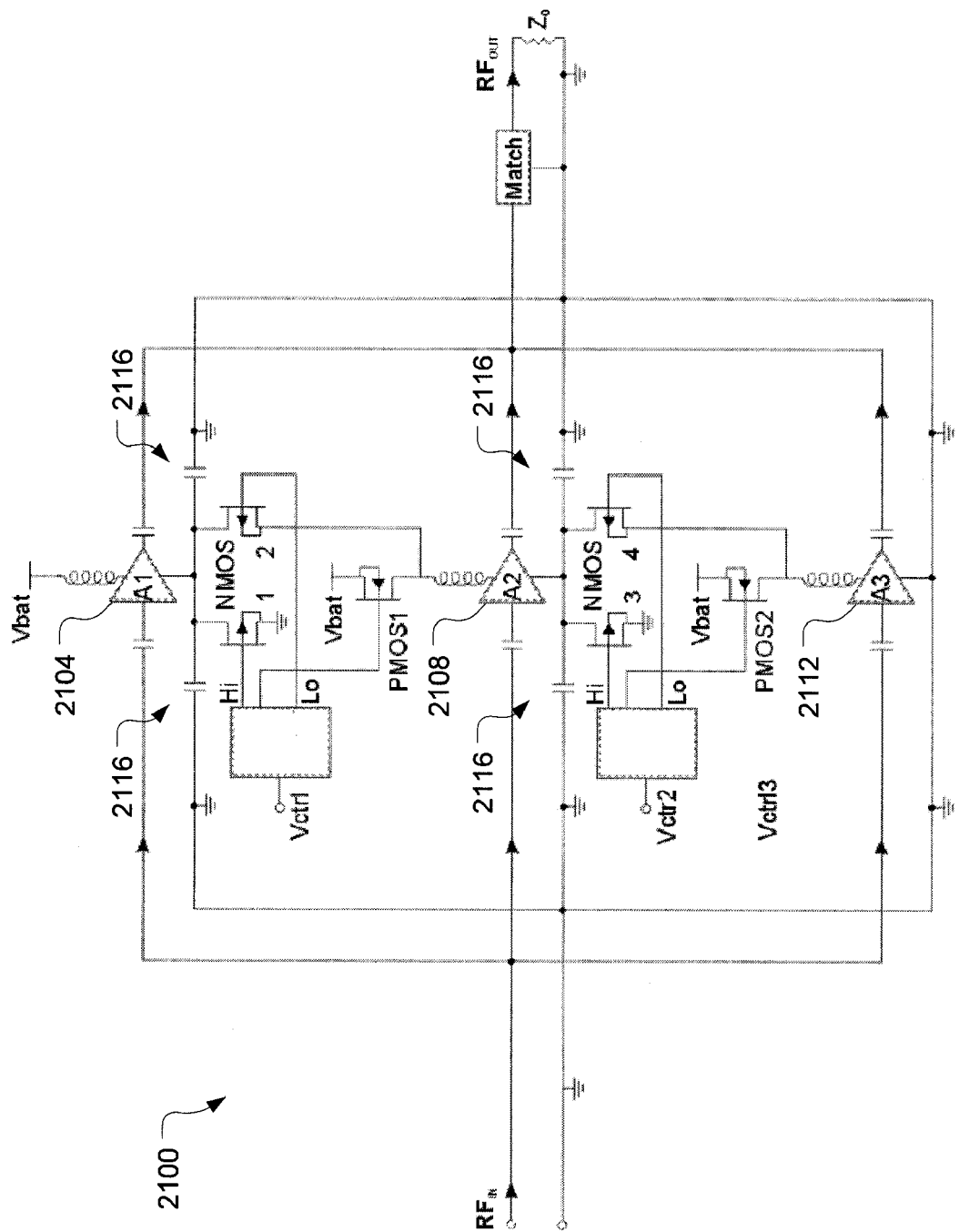

FIG. 21 illustrates a PA 2100 in accordance with some embodiments. The PA 2100 may provide a reconfigurable DC supply coupling to three PA blocks, as opposed to the two-block embodiments of PAs 1600-2000. The PA 2100 may be flexible enough to implement any of the reconfiguration embodiments described above, including, but not limited to, embodiments described with respect to FIG. 4, 6, 8, or 10.

The PA 2100 may include PA blocks 2104, 2108, and 2112. PA blocks 2104 and 2108 may each have a virtual RF ground provided by a respective pair of blocking capacitors 2116, similar to the virtual RF grounds discussed above with respect to any of the PAs 1600-2000.

The PA 2100 may use switches to control NMOS transistors to either couple the ground rails to a DC ground or to a high-side of a DC supply of another PA block, similar to the operation described above with respect to PAs 1600-2000. Again, depending on the Vcc supply configuration selected, either PMOS or NMOS devices may be used to control the output power of the PA 2100.

Figure 22:
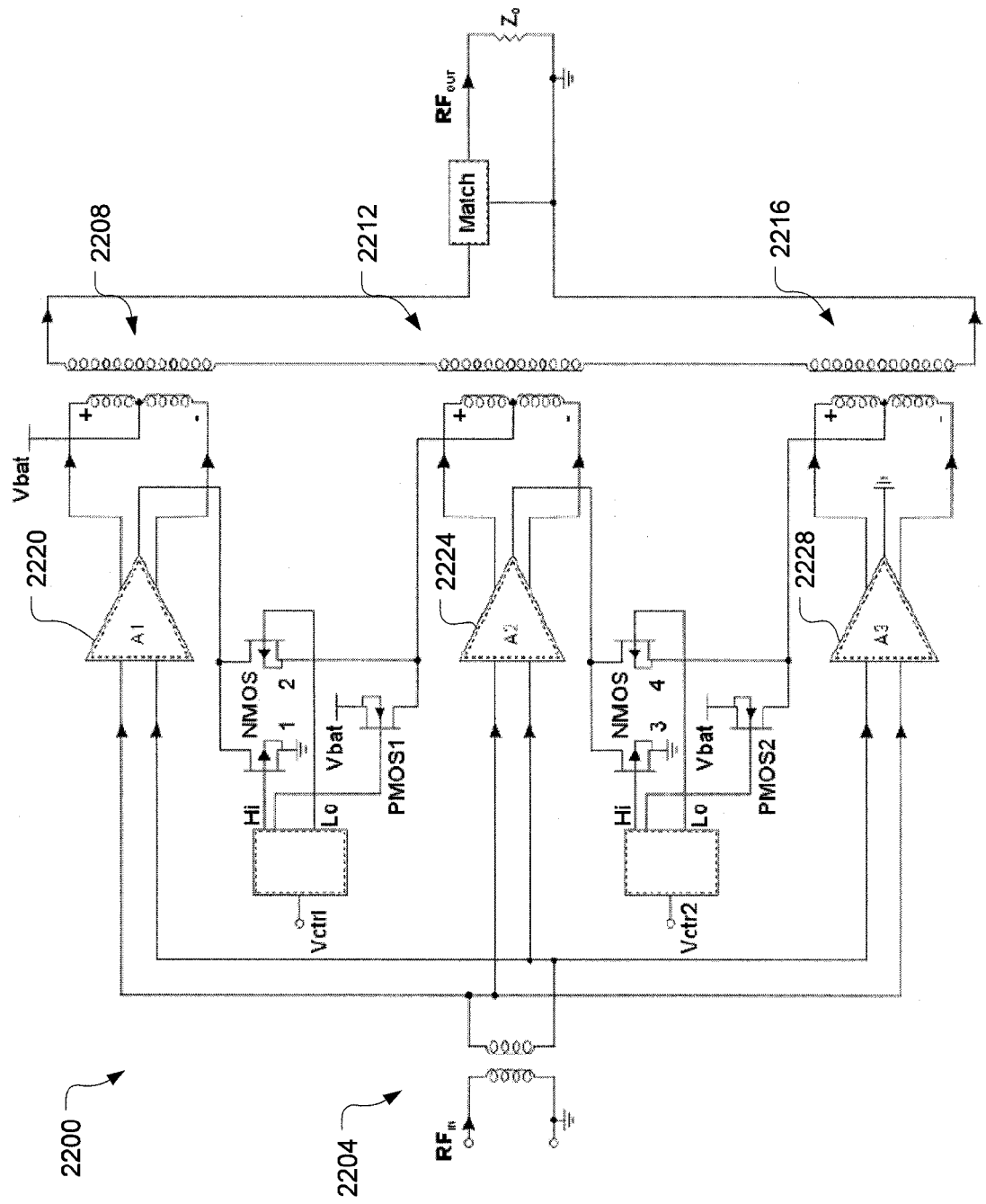

FIG. 22 illustrates a PA 2200 in accordance with some embodiments. The PA 2200 may provide a reconfigurable DC supply coupling to three differential PA blocks. The PA 2200 uses an input transformer 2204 and three output transformers 2208, 2212, and 2216 that, together with the differential amplifiers, provide the isolation between the DC and RF terminals that was provided above through the blocking capacitors. Some desirable characteristics of the output transformers 2208, 2212, and 2216 include: capacity to carry high current, e.g., ~2 amps (A) or more; a low series resistance; and a compact design.

The input transformer 2204 may include a balun to convert a single-ended RF input, RFin, into a differential RF signal that is applied to PA blocks 2220, 2224, and 2228. The RF outputs from the PA blocks 2220, 2224, and 2228 then feed respective primary windings. An RF output, RFout, may be taken off of secondary windings and may be single-ended or balanced. As before, switches may control NMOS transistors to reconfigure DC coupling to the PA blocks 2220, 2224, and 2228.

The center point of the primary winding of the output transformers 2208, 2212, and 2216, which may act as a virtual RF ground, may be used for the DC inputs, Vbat, as shown. The differential nature of the PA 2200 may provide a very high isolation between the DC feed and the RF signals.

In addition to realizing high DC-RF isolation, the PA 2200 may have other advantages compared to conventional LC-output match PAs. For example, the PA 2200 may have a wider bandwidth and/or greater durability.

While FIGS. 16-22 describe implementations with two and three blocks, other embodiments may provide implementations with any number of blocks in similar manners. Furthermore, while FIGS. 2-15 describe possible DC configuration options, other embodiments may provide other DC configuration options in accordance with the teachings of this disclosure.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A circuit comprising:
a first power amplifier (PA) block to receive an input radio frequency (RF) signal and to provide a first amplified RF signal;
a second PA block to receive the input RF signal and to provide a second amplified RF signal; and
a switch having a first switch state to couple a power supply with the first PA block and the second PA block in a first configuration and a second switch state to couple the power supply with the first PA block and the second PA block in a second configuration, wherein the first configuration is a parallel configuration and the second configuration is a serial configuration.

2. The circuit of claim 1, further comprising:
a third PA block,
wherein the first switch state is to further couple the power supply with the third PA block in the first configuration, and the second switch state is to further couple the power supply with the third PA block in the second configuration.

3. The circuit of claim 2, wherein the switch further includes a third switch state to couple the power supply with the first PA block, the second PA block, and the third PA block in a third configuration that is a serial and parallel configuration.

4. The circuit of claim 1, further comprising:
one or more negative-channel metal oxide semiconductor (NMOS) transistors coupled with, and controllable by, the switch to reconfigure the circuit between the first configuration and the second configuration.

5. The circuit of claim 4, further comprising:
a linear voltage regulator coupled with the second PA block; and
the switch to adjust a first NMOS transistor of the one or more NMOS transistors and the linear voltage regulator to provide a corresponding adjustment of a voltage provided to the first PA block and the second PA block, while the power supply is coupled with the first PA block and the second PA block in the first configuration, to provide the first and second amplified RF signals with a first range of power, and the switch is to further adjust solely a second NMOS transistor of the one or more NMOS transistors to provide a corresponding adjustment of the voltage provided to the first PA block and the second PA block, while the power supply is coupled with the first PA block and the second PA block in the second configuration, to provide the first and second amplified RF signals with a second range of power.

6. The circuit of claim 1, further comprising:
one or more linear voltage regulators coupled with the first PA block and/or the second PA block and configured to receive one or more control signals and to control a voltage provided to the first PA block and/or the second PA block based at least in part on the one or more control signals.

7. The circuit of claim 6, further comprising:
a switch controller coupled with the switch and configured to control the switch based at least in part on the regulated voltage provided to the first PA block and/or the second PA block.

8. The circuit of claim 1, wherein the first PA block is a first output stage of a PA chain and the second PA block is a second output stage of the PA chain.

9. The circuit of claim 8, wherein the PA chain includes one or more preliminary stages statically coupled with the power supply.

10. The circuit of claim 1, wherein the first PA block is one of a plurality of stages of a first PA chain; the second PA block is one of a plurality of stages of a second PA chain; the first switch state is to couple the power supply with the plurality of stages of the first PA block and the plurality of stages of the second PA block in the first configuration; and the second switch state is to couple the power supply with the plurality of stages of the first PA block and the plurality of stages of the second PA block in the second configuration.

11. The circuit of claim 1, wherein the first PA block and the second PA block are configured to receive the input RF signal in a manner independent of whether the circuit is in the first configuration or the second configuration.

12. The circuit of claim 1, wherein each of the first PA block and the second PA block is associated with a respective output matching network.

13. The circuit of claim 1, further comprising:
a ground rail having a pair of direct current (DC)-blocking capacitors and coupled with the first PA block at a point between the pair of DC-blocking capacitors.

14. The circuit of claim 1, further comprising:
an input transformer to receive a single-ended input signal and to output a differential signal to the first PA block and the second PA block;
a first output transformer to receive an amplified differential signal from the first PA block; and
a second output transformer to receive an amplified differential signal from the second PA block.

15. The circuit of claim 1, further comprising:
a first amplifier path including the first PA block;
a second amplifier path, parallel to the first amplifier path, including the second PA block;
an input quadrature hybrid coupled with the first amplifier path and the second amplifier path and configured to receive the input RF signal; and
an output quadrature hybrid coupled with the first amplifier path and the second amplifier path and configured to output a third output RF signal.

16. A method comprising:
coupling a power supply to a first power amplifier (PA) block and a second PA block in a first configuration;
controlling a voltage provided to the first PA block and the second PA block, while the power supply is coupled with the first PA block and the second PA block in the first configuration, to provide an output radio frequency (RF) signal with a first range of power;
coupling the power supply with the first PA block and the second PA block in a second configuration, wherein the first configuration is a parallel configuration and the second configuration is a serial configuration; and
controlling the voltage provided to the first PA block and the second PA block, while the power supply is coupled with the first PA block and the second PA block in the second configuration, to provide the output RF signal with a second range of power.

17. The method of claim 16, wherein the first range and the second range are adjacent, non-overlapping ranges.

18. The method of claim 16, further comprising:
coupling the power supply with a third PA block in the first configuration; and
coupling the power supply with the third PA block in the second configuration.

19. The method of claim 18, further comprising:
coupling the power supply with the first PA block, the second PA block, and the third PA block in a third configuration; and controlling the voltage provided to the first PA block, the second PA block, and the third PA block, while the power supply is coupled with the first PA block, the second PA block, and the third PA block in the third configuration, to provide the output RF signal with a third range of power.

20. The method of claim 16, wherein said controlling the voltage provided while the power supply is coupled in the first configuration comprises:

varying the voltage provided to the first PA block and the second PA block between a first voltage that corresponds to a full output power level of the output RF signal and a second voltage that corresponds to a back-off output power level.

21. A system comprising:

a power supply;

a transmitter including a radio frequency (RF) power amplifier having
- a first power amplifier (PA) block to receive an input RF signal and to provide a first amplified RF signal;
- a second PA block to receive the input RF signal and to provide a second amplified RF signal; and
- a switch having a first switch state to couple the power supply with the first PA block and the second PA block in a first configuration and a second switch state to couple the power supply with the first PA block and the second PA block in a second configuration, wherein the first configuration is a parallel configuration and the second configuration is a serial configuration; and an antenna structure coupled with the transmitter to transmit an output RF signal, based at least in part on the first amplified RF signal and the second amplified RF signal, over the air.

22. The system of claim 21, wherein the power amplifier further comprises:

a third PA block; and the first switch state is to further couple the power supply with the third PA block in the first configuration, and the second switch state is to further couple the power supply with the third PA block in the second configuration.

23. The system of claim 22, wherein the switch further includes a third switch state to couple the power supply with the first PA block, the second PA block, and the third PA block in a third configuration that is a serial and parallel configuration.

24. The system of claim 21, further comprising:

one or more negative-channel metal oxide semiconductor (NMOS) transistors coupled with, and controllable by, the switch to reconfigure the circuit between the first configuration and the second configuration.

* * * * *